US006215060B1

(12) United States Patent
Komori et al.

(10) Patent No.: US 6,215,060 B1
(45) Date of Patent: Apr. 10, 2001

(54) METHOD FOR MANUFACTURING A SOLAR CELL MODULE

(75) Inventors: Ayako Komori, Joyo; Akiharu Takabayashi; Toshihiko Mimura, both of Nara; Masahiro Mori, Soraku-gun; Takeshi Takada, Kyotanabe, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/062,642

(22) Filed: Apr. 20, 1998

(30) Foreign Application Priority Data

Apr. 21, 1997 (JP) .................................................. 9-103225
Sep. 24, 1997 (JP) .................................................. 9-258532

(51) Int. Cl.$^7$ .................................................. H01L 25/00
(52) U.S. Cl. ........................... 136/251; 136/259; 438/64; 438/66; 156/196; 156/212; 156/220; 156/224; 156/226
(58) Field of Search ................................ 136/251, 259; 438/64, 66; 72/166, 176, 182; 156/196, 212, 220, 224, 226

(56) References Cited

U.S. PATENT DOCUMENTS

| 1,909,930 | * | 5/1933 | Ridder | 72/166 |
| 4,686,321 | * | 8/1987 | Kishi | 136/244 |
| 6,025,555 | * | 2/2000 | Mori et al. | 136/251 |

FOREIGN PATENT DOCUMENTS

| 9312518U | 11/1993 | (DE) | H01L/31/048 |
| 0554877 | 8/1993 | (EP) | H01L/31/18 |
| 0625802 | 11/1994 | (EP) | H01L/31/042 |
| 0768721 | 4/1997 | (EP) | H01L/31/048 |
| 60-201667 | 10/1985 | (JP) | H01L/31/04 |
| 4-266069 | 9/1992 | (JP) | H01L/31/04 |
| 7302924 | 11/1995 | (JP) | H01L/31/042 |
| 8222752 | 8/1996 | (JP) | H01L/31/042 |
| 8222753 | 8/1996 | (JP) | H01L/31/042 |

OTHER PUBLICATIONS

Nakatani, K., et al. "Electrical properties of hydrogenated amorphous silicon layers on a polymer film substrate under tensile stress," *Applied Physics Letters*, vol. 54(17), 1989, pp. 1678–1680.

Utsunomiya, Michito, et al., "Effect of mechanical strain on electrical characteristics of hydrogenated amorphous silicon junctions," Journal of Applied Physics, vol. 66(1), 1989, pp. 308–311.

* cited by examiner

Primary Examiner—Mark Chapman
(74) Attorney, Agent, or Firm—Fitzpatrick, Cella, Harper & Scinto

(57) ABSTRACT

In order to ensure long-term reliability when a photovoltaic element is bent or curved to be deformed: (1) In a method for manufacturing a solar cell module having a photovoltaic element encapsulated with a resin on a support member, the step is adopted which forms a bent portion in the photovoltaic element and in the support member, wherein the formation of the bent portion is performed while reducing a working pressure in the normal direction to a surface of the photovoltaic element; and (2) In a solar cell module comprising a photovoltaic element comprising at least one photoactive semiconductor layer on a flexible substrate, at least a part of the flexible substrate is subjected to tensile deformation in the direction parallel to a surface of the substrate with a strain less than a critical strain to lower the fill factor of the photovoltaic element, whereby the photovoltaic element is deformed.

32 Claims, 11 Drawing Sheets

METHOD FOR MANUFACTURING A SOLAR CELL MODULE

BACKGROUND OF THE INVENTION

1. Field of the Invention

The present invention relates to a solar cell module and a method for manufacturing the same and more particularly to a wide variety of solar cell modules with high reliability in which a region including a photovoltaic element is processed, and a method for manufacturing the modules.

2. Related Background Art

The solar cells popularly used at present are those of the type using crystal-based silicon and of the type using amorphous silicon. Among others, the amorphous silicon solar cells, in which silicon is deposited on a conductive metal substrate and a transparent, conductive layer is formed thereon, are promising, because they are inexpensive and lighter than the solar cells of the crystal-based silicon, and they have good impact resistance and high flexibility. In recent years, the amorphous silicon solar cells have been mounted on roofs and walls of buildings, taking advantage of the lightweight property, the good impact resistance, and the flexibility, which are the characteristics of the amorphous silicon solar cells. In this case, a support member (reinforcing sheet) is stuck to a non-light-receiving surface of a solar cell with an adhesive, and the composite is used as a building material. This sticking with a support member increases the mechanical strength of a solar cell module, thus preventing warpage and distortion thereof due to change in temperature. Particularly, since they can capture more sunlight, installation thereof on a roof is desirably conducted. In applications to the roofs, the conventional methods involved procedures of mounting a frame on a solar cell, setting a stand on the roof, and installing the solar cells thereon; whereas the solar cell modules with the support member stuck can be installed as roof materials directly on the roof by bending the support member. This achieves great reductions in the cost for raw materials and in the number of working steps, whereby inexpensive solar cell modules can be provided. In addition, the solar cells become very lightweight, because neither the frame nor the stand is necessitated. Namely, the solar cells can be handled as metallic roof materials, which are drawing attention recently because of their excellent mountability, light weight, and excellent earthquake resistance.

For example, the roof material and solar cell combination module proposed in Japanese Patent Application Laid-open No. 7-302924 is excellent in mountability because it is used in the same manner as the ordinary roof materials; it is also easy to handle because conventional machines can be used. This solar cell module is, however, constructed in such a structure that the photovoltaic element is located in a flat portion of a laterally-roofed flat-seam roof material and is not deformed at all.

In recent years, however, the originality of individuals has become increasingly valued, and this tendency is also the case for the building materials and solar cells. In order to produce the solar cells or building materials that meet various needs and have a wide variety of shapes, it is necessary to ensure the workability of all the regions including the photovoltaic elements rather than to always keep the regions above the photovoltaic elements flat.

Japanese Patent Application Laid-open No. 8-222752 or No. 8-222753 or Japanese Patent Publication No. 6-5769 describes a corrugated solar cell module as an example responding to the need for variety. In either case, the photovoltaic element is arranged in a corrugated manner in order to increase utilization efficiency of light, and the manufacturing method thereof involves a procedure of sticking the photovoltaic elements to a steel sheet or the like worked in a corrugated sheet shape, with an adhesive.

On the other hand, there are reports on studies of the relation between a-Si:H (hydrogenated amorphous silicon) layer and strain thereof.

For example, Appl. Phys. Lett. 54 (17), 1989, pp. 1678–1680, "Electrical properties of hydrogenated amorphous silicon layers on polymer film substrate under tensile stress," reports a change of resistance in a dark state where a tensile force is applied to a single film of a-Si:H (0.5 $\mu$m thick and mainly of i-type a-Si:H) deposited on a PET/substrate (100 $\mu$m thick). The detailed contents of this report are as follows.

Under the tensile force, the a-Si:H layer gradually increases its resistance (reversible) because of the piezoresistance effect before 0.7% strain is reached; however, it experiences a quick increase (irreversible) of resistance after 0.7% strain has been exceeded, because weak Si-Si bonds are broken. However, the a-Si:H layer with increased resistance due to 0.7% or more strain can be restored by annealing at 150° C. for one hour.

Further, J. Appl. Phys. 66 (1), 1989, pp. 308–311, "Effect of mechanical strain on electrical characteristics of hydrogenated amorphous silicon junctions," reports the piezojunction effect of a-Si:H having the pin junction. The detailed contents of this report are as follows.

When a-Si:H having the pin junction is distorted in parallel with the pin junction, 8% decrease of current takes place both in the forward direction and in the reverse direction under the tensile stress of 7500 $\mu\epsilon$ (in the dark state). Further, 8% increase of current occurs under the compressive stress of 7500 $\mu\epsilon$.

There is, however, nothing described as to specific stress on the photovoltaic element on the occasion of bending the photovoltaic element into the corrugated shape or the like in the above conventional techniques. Namely, they fail to describe either a displacement amount of substrate, a displacement amount of photovoltaic element, or a displacement amount of solar cell module. There is nothing described about the effect of the stress and deformation and about their reliability at all.

Under such circumstances, the production of solar cell modules in which the photovoltaic elements are shaped so as to be placed under stress or deformed has been avoided; if a module is shaped, the reliability in that shape must be always examined. Since many reliability tests must usually be conducted for one product (a worked shape), much time is necessary to make a commercially available product. This method is not suitable for bringing the product to the commercial stage at a speed that meets the need for present solar cells and building materials required to provide a wide variety of products.

As described above, the following points need to be met in order to produce a wide variety of solar cell modules with high reliability at higher speed.

(1) To define a specific, deformable region of the photovoltaic element on the occasion of work of the region including the photovoltaic element.

(2) To ensure long-term reliability where the photovoltaic element is deformed.

SUMMARY OF THE INVENTION

The inventor found the following methods best after intensive and extensive research and development for achieving the above points.

(1) In a method for manufacturing a solar cell module having a photovoltaic element encapsulated with a resin on a support member, the step is adopted which forms a bent portion in the photovoltaic element and in the support member, wherein the formation of the bent portion is performed while reducing a working pressure in the normal direction to a surface of the photovoltaic element; and (2) In a solar cell module comprising a photovoltaic element comprising at least one photoactive semiconductor layer on a flexible substrate, at least a part of the flexible substrate is subjected to tensile deformation in the direction parallel to a surface of the substrate with a strain less than a critical strain to lower the fill factor (hereinafter referred to as F.F.) of the photovoltaic element, whereby the photovoltaic element is deformed.

DETAILED DESCRIPTION OF THE PREFERRED EMBODIMENTS

Figure 1A:
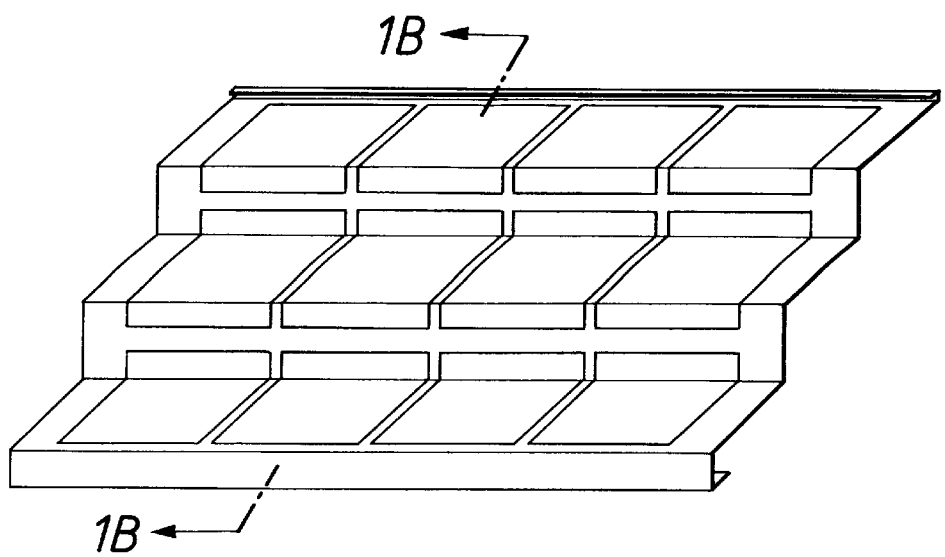
FIG. 1A is a perspective view of a solar cell module according to the present invention.
Figure 1B:
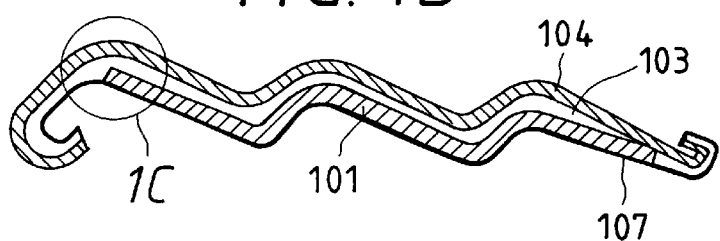
FIG. 1B is a cross-sectional view taken along the line 1B—1B of FIG. 1A.
Figure 1C:
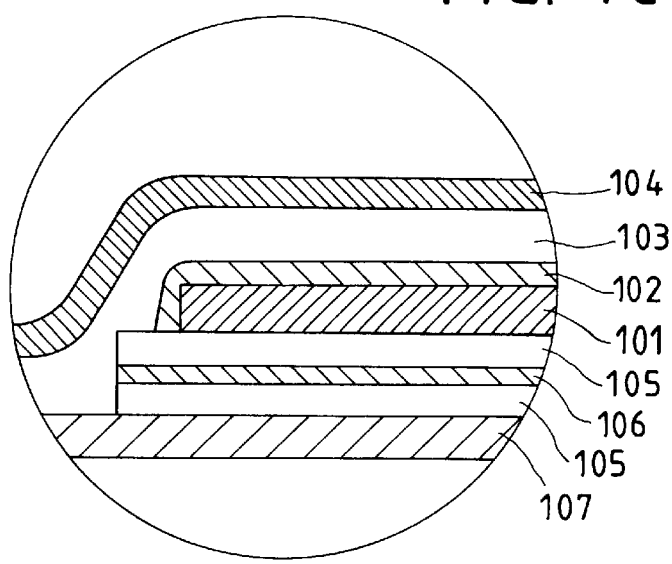
FIG. 1C is an enlarged view of the portion 1C of FIG. 1B.

FIGS. 1A to 1C are a perspective view, a cross-sectional view and a partial enlarged view of a solar cell module according to the present invention. In FIGS. 1A to 1C, reference numeral 101 designates photovoltaic elements, 102 a fibrous inorganic, compound, 103 a transparent, organic polymer compound as a front surface filler, 104 a transparent resin film located outermost, 105 a transparent, organic polymer compound as a back surface filler, 106 a back surface insulating film, and 107 a support member.

A processed shape adopted in the present invention will be described. First, a flat-plate solar cell module is produced, and thereafter it is bent so as to have a continuous bent portion as shown in FIGS. 1A to 1C. It is, however, noted that, although FIGS. 1A to 1C show an example of the solar cell module having the continuous bent portion, the invention is not limited to this example; the solar cell module can be processed so as to have a bent portion only in a part thereof or so as to have many depressed and projected portions.

By the manufacturing method according to the present invention, the photovoltaic elements can be processed without damage. Specifically, the manufacturing method involves reducing the bending pressure in the step of forming the bent portion, so as to produce the solar cell module without damage to the photovoltaic elements. It can, therefore, manufacture solar cell modules with high reliability.

For example, as in FIGS. 1A to 1C, the large solar cell module can be processed into a roof material having steps of narrow working width. Therefore, the solar cell module becomes a roof material also excellent in the aesthetic sense and in mountability with less joint portions because there is no need to provide each step with a joint portion. In addition, the photovoltaic elements can be arranged on the support member, irrespective of the working width, so that the rate of photovoltaic element per area can also be increased, whereby the output from the solar cells can be extracted efficiently.

Further, the capability of processing the support member including the portions provided with the photovoltaic elements gives rise to the diversity of external configurations, without having to be limited to that of FIGS. 1A to 1C, and permits production of original building materials excellent in the aesthetic sense.

Since the support member, even with the photovoltaic elements, can be processed in the same steps as the building materials using the normal steel sheet, the conventional manufacturing apparatus can be used without much change. This lowers the manufacturing cost.

Method for Forming Bent Portion

Since the portions where the photovoltaic elements exist are bent, it is necessary to ensure the reliability of the photovoltaic elements. The inventors found that it was desirable to provide means for reducing the bending pressure normally exerted on the surface of photovoltaic elements during work. More specifically, it was found that the pressure exerted on the photovoltaic element was desirably not more than 500 kgf/CM².

Figure 14:
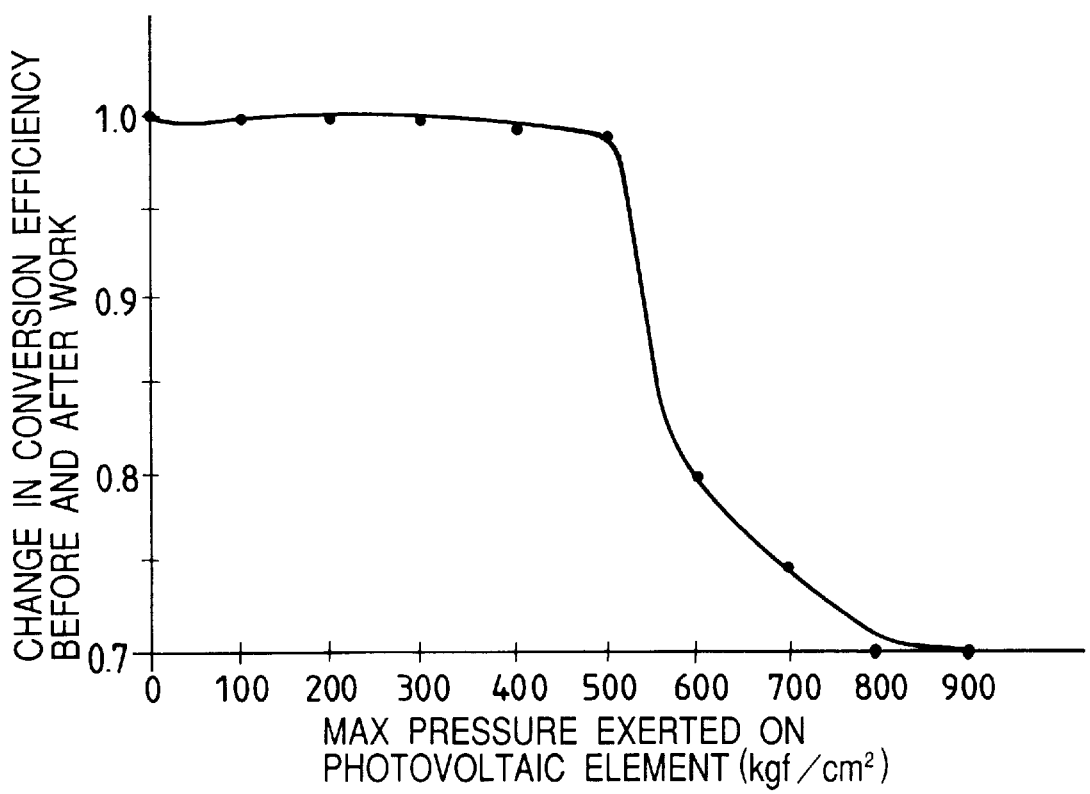
FIG. 14 is a graph showing the relation between maximum pressure exerted on the photovoltaic element and change in photoelectric conversion efficiency before and after processing where the photoelectric conversion efficiency before processing is 1.

FIG. 14 is a graph showing the relation between maximum pressure exerted on the photovoltaic element and change in the photoelectric conversion efficiency before and after processing where the photoelectric conversion efficiency before processing is 1. It is seen that the application of pressure greater than 500 kgf/cm² increases the damage to the photovoltaic element, thereby resulting in significant lowering of conversion efficiency and thus failing to ensure the reliability required for a solar cell module.

A conceivable method for manufacturing the solar cell module without exerting the processing pressure on the photovoltaic element is a method for sticking solar cell modules onto a support member preliminarily processed. This processing method is, however, different from the ordinary processing step using the ordinary steel sheet, so that this manufacturing method has lower mass-productivity; in addition, this processing method increases the cost, because it necessitates another material such as an adhesive.

Figure 13:
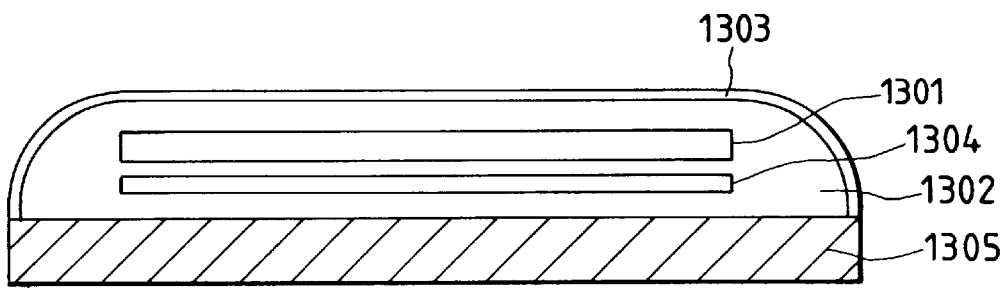
FIG. 13 is a cross-sectional view of a flat-plate shaped solar cell module.

Hence, the above formation of the bent portion is carried out desirably as follows: a flat-plate solar cell module is first formed as shown in FIG. 13, and thereafter it is bent by a press molding machine, a roller former molding machine, or a bender molding machine.

Figure 9:
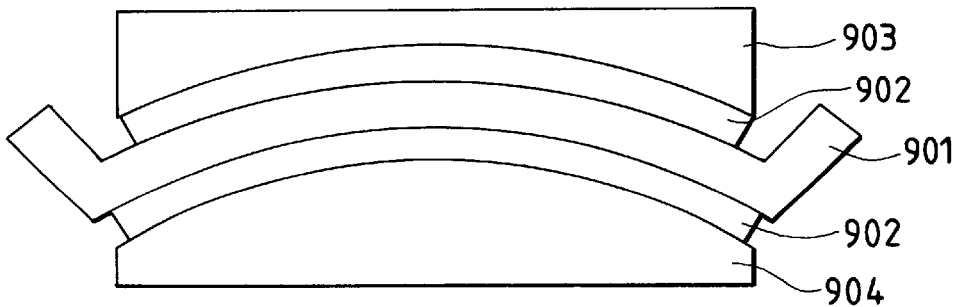
FIG. 9 is a cross-sectional view of the solar cell module under curving with a press working machine.

The press molding machine can be applied readily to any shapes, even to irregular shapes, once molds are made. Thus the press molding machine is suitable for processing the building material as shown in FIG. 9. In the case of molding by press work, the solar cell module is processed while being placed between an upper mold and a lower mold. In this case, if pressure over 500 kgf/cm² is exerted on the photovoltaic element, it will damage the photovoltaic element, so as to degrade the reliability of the solar cell. The following methods should be employed in order to reduce the pressure.

A first method is a method for applying the pressure onto only the region of the support member where the photovoltaic element of the solar cell module does not exist, so as to plastically deform a part or the whole of the support member, thereby molding the bent portion. This permits the solar cell module to be processed without touching the regions above the photovoltaic elements at all.

Another method is a method for placing a buffer material of a sheet of rubber, urethane, foam, nonwoven fabric, polymer resin, or the like between the press molds and the solar cell module. This scatters the pressure of the press molds to thereby decrease the pressure on the photovoltaic elements.

A further effective method is a method for providing a clearance between the solar cell module and the processing machine at the bottom dead center of the press. Namely, the solar cell module can be processed without imposing the pressure on the entire solar cell module. When the step of forming the bent portion is done by press molding, the workability is enhanced. Since this is generally accomplished using a steel sheet, the solar cell module can be easily processed.

The roller former molding machine is excellent in processing in the longitudinal direction. The same molding machine is ready for steel sheets of different lengths. Particularly, the roller former can be applied to a long steel sheet and complicated bending and is ready for high-speed work. Thus this is a method of high mass-productivity. In this case, it is also preferable to wrap rollers used in the roller former with a buffer material of a sheet of rubber, urethane, foam, nonwoven fabric, polymer resin, or the like in order to reduce the pressure on the photovoltaic element.

The bender bending machine can bend a material by simple device structure. It is effective for simple bending and bending of a relatively small steel sheet. However, since the radius of curvature of a blade of the bender is normally small, the pressure is concentrated on the photovoltaic element during bending thereon. To reduce the pressure, the buffer material is thus desirably used between the blade of the bender and the solar cell module. Preferred buffer materials are sheets of rubber, urethane, foam, nonwoven fabric, polymer resin, and the like, as above. Another means to reduce the pressure is to increase the radius of curvature of the blade of the bender to not less than 100 mm. When the step of forming the bent portion is carried out by bending with the bender, the bent portion can be formed by this inexpensive and easy method. Particularly, this method is effective to process a short solar cell module.

Further, in the case where the solar cell module is bent for use as a roof material, the support member is sometimes bent at edge portions of the solar cell module. FIGS. 1A to 1C show an example of such case, wherein one of two opposing edge portions is bent into the light-receiving side, while the other is bent into the non-light-receiving side. This bending greatly improves the mountability, because, in the case of the roof material and solar cell combination modules of the present invention being mounted from the eave edge, they can be mounted simply by fitting the bent portions of the upper and lower solar cell modules adjacent to each other on a joint basis. Since this bending obviates the need for the frame and stand necessitated in the conventional mounting methods for laying solar cells on a roof, this method can reduce cost largely and also reduce weight. When this bending is done using a roller former, the working speed can be increased and further reduction of cost can be achieved.

When the solar cell module of the present invention is compared with the conventional one of the type wherein the solar cell module is mounted on the building material, the solar cell module also functioning as the building material of the invention does not necessitate the building material and can thus be obtained at low cost.

Relation Between Photovoltaic Element and Strain

An experiment to show the relation between the photovoltaic element of the present invention and strain will be described in detail. The photovoltaic element used is of a configuration in which a back surface reflective layer, a photoactive layer of amorphous silicon semiconductors of the pin junction type, a transparent, conductive layer, and a collector electrode are stacked on a substrate. The experiment was conducted using this photovoltaic element, and the results of the experiment will be described. First, a strain gage was stuck to the non-light-receiving surface of the substrate of the photovoltaic element. After that, initial characteristics were measured. This sample was subject to tensile (expanding) stress (strain) which pulled the photovoltaic element in the direction parallel to the surface of the substrate with a tensile tester. In this case, measurement was conducted at each of peak strains up to 12000 $\mu\epsilon$ (1.2% elongation) of the substrate. Characteristics of samples with different strains were measured again in this way, and surfaces of the photovoltaic elements were finally observed by an SEM (scanning electron microscope).

Figure 15:
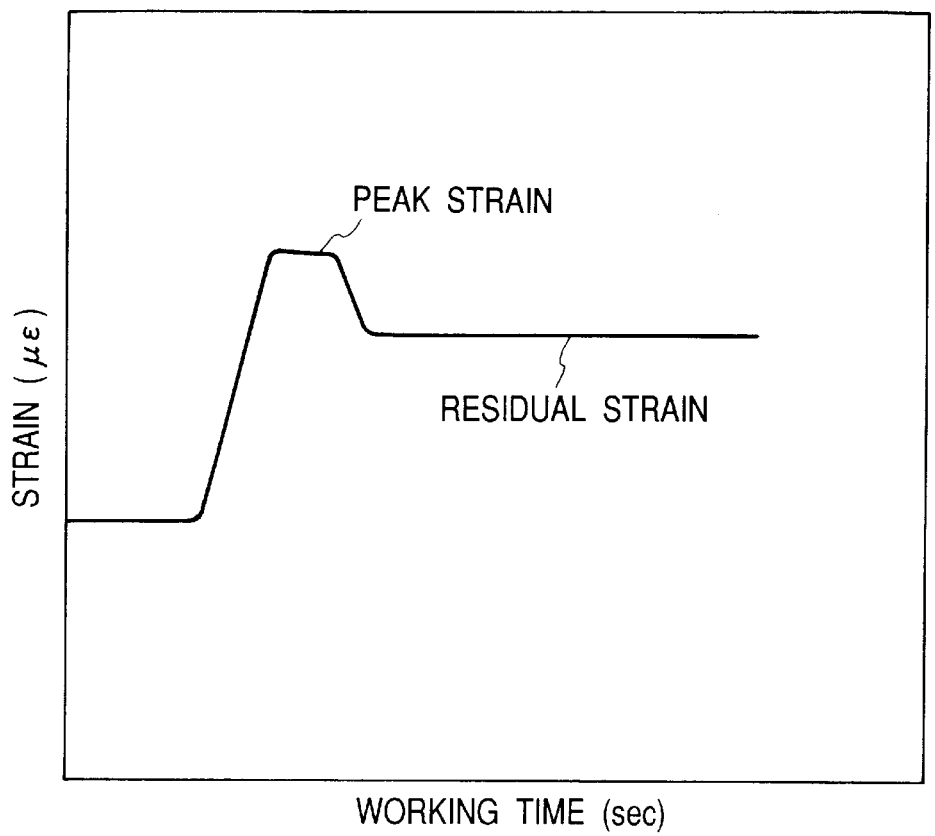
FIG. 15 is a graph showing an example of strain during processing of a photovoltaic element.

The strain can be classified into two types, peak strain appearing during application of the tensile force and residual strain remaining even after release of the tensile force (FIG. 15). If defects such as cracks occur in a-Si:H at the point of the peak strain during the tensile force application, the defects will not be compensated for even by elimination of all of the residual strain. Therefore, when the relation between the deformable region of a photovoltaic element and strain is considered, the peak strain is significant.

Figure 16:
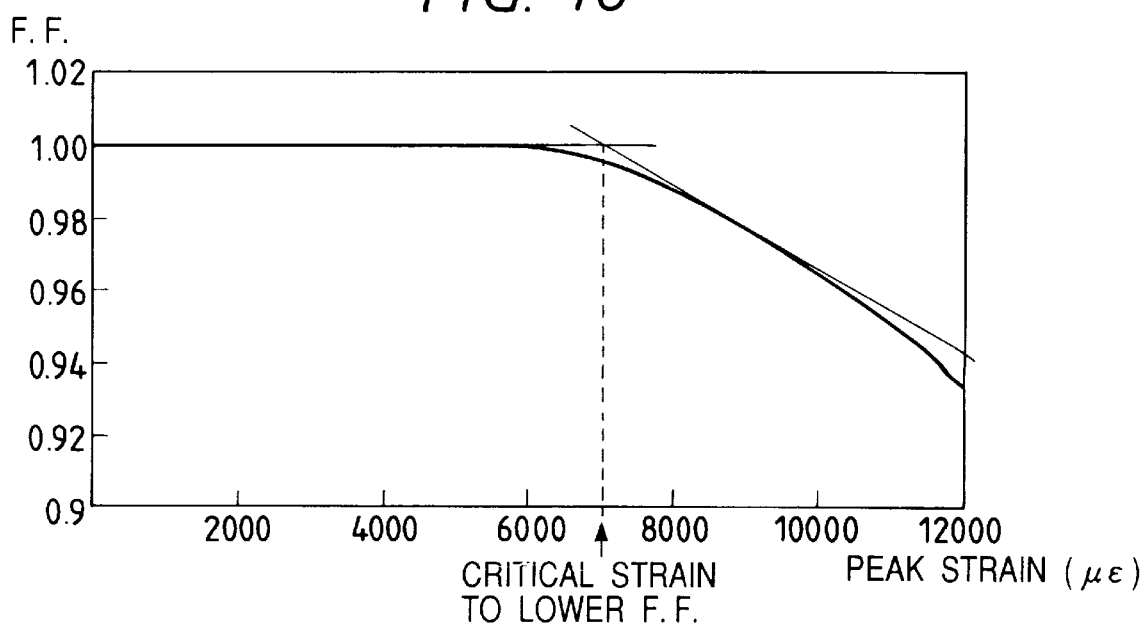
FIG. 16 is a graph showing the relation between peak strain of a-Si:H and F.F.

The results of the above experiment are shown in FIG. 16. First described referring to FIG. 16 is a definition of the critical strain which lowers F.F. of the photovoltaic element. A graph is made to show the relation between strain of the photovoltaic element and F.F. change rate. In that case, as shown in FIG. 16, the decline (lowering) of F.F. starts at a certain strain point. Since this decline of F.F. draws a gentle curve, the critical strain which lowers F.F. is determined at an intersecting point of two tangent lines drawn as illustrated. In the case of FIG. 16 using a-Si:H, the intersecting point between the two tangent lines is at 7000 $\mu\epsilon$ (0.7% strain). This means that F.F. starts decreasing when the peak strain becomes 7000 $\mu\epsilon$ or more. Thus, for processing the photovoltaic element and ensuring the reliability thereof, the peak strain in the photovoltaic element should be desirably less than the critical strain which lowers F.F. (0.7% in the case of a-Si:H) during processing. In order to deform the photovoltaic element under this condition, the flexible substrate is made of a material having a plastic deformation region less than the critical strain which lowers F.F. (0.7% in the case of a-Si:H). The photovoltaic element is deformed while the substrate is deformed under the strain less than the critical strain which lowers F.F. (0.7% in the case of a-Si:H). This results in a deformed photovoltaic element without degrading the performance of the photoactive semiconductor layer on the substrate.

Here, F.F. is defined as follows: F.F.=maximum power (Pm)/(short circuit current (Isc)×open circuit voltage (Voc)). The physical meaning thereof is a ratio of the power Pm actually taken out to a product of Voc, which is a value where only the voltage is maximum, and Isc, which is a value where only the current is maximum. An actual value of F.F. is determined by forward characteristics of pn junction, and thus F.F. will decrease if a leak current flows through defects contained in the semiconductor substrate used and defects produced during production of an junction or during production steps thereafter. This will result in decreasing the output that is expected. From this aspect, decrease in F.F. after the tensile force application test indicates occurrence of defects in the semiconductor layer due to the tensile test.

As also seen from the above, in the case of a-Si:H, when the peak strain is not less than 0.7%, i.e., when a photovoltaic element has a strain not less than the critical strain which lowers F.F., it is believed that defects have been generated in the photovoltaic element.

When the photovoltaic element was observed from the light-receiving side by an SEM, many cracks were observed in the normal direction to the flexible substrate in portions where the strain was not less than the critical strain which lowers F.F. From the degradation in characteristics of the solar cell at this time, it is supposed interfacial separation also occurred between films in the configuration of substrate/metal layer/transparent electrode layer/active semiconductor layers/transparent electrode or within the active semiconductor layers.

Places where the strain appears in the bending as shown in FIGS. 1A to 1C are top and bottom portions in the stepped shape. The maximum strain appears at the top portions of the stepped shape. The strain also appears in the bottom portions, but it is very small.

FIGS. 1A to 1C show the example in which the solar cell module is bent in the continuous step shape, but the invention is by no means limited to this example. For example, only a part of the solar cell module can be bent, the solar cell module can be bent so as to have many depressed and projected portions, or a flat-plate solar cell module can be processed as to suffer tensile stress in the flat shape, as long as the processing causes plastic deformation while keeping the strain of the flexible substrate less than the critical strain which lowers F.F. Since the solar cell module can be worked irrespective of presence or absence of the photovoltaic element, a large solar cell module can be worked into a roof material of the step shape with a narrow working width, for example, as shown in FIGS. 1A to 1C, and the roof using such solar cell modules will be excellent in the aesthetic sense and also excellent in mountability with less joint portions because there is no need to provide a joint portion for each step. Further, the arrangement of the photovoltaic elements does not have to be changed depending upon the configuration of the solar cell module, and the same flat-plate solar cell module can be processed in a variety of shapes. Therefore, the solar cell module is excellent in workability and productivity. Specifically, considering processing of the solar cell module provided with the support member, the support member is often made of a material having higher rigidity than the substrate, and it is thus hard to maintain the processed shape of the solar cell module by only plastic deformation of the flexible substrate. In that case, an example of processing the shape of a solar cell module is plastically deforming only portions no photovoltaic element is present on the support member, thereby maintaining the shape of the entire support member. By this method, the solar cell module provided with the support member can be processed as a solar cell module while keeping the strain of the flexible substrate less than the critical strain which lowers F.F., and the shape thereof can be maintained thereby; therefore, the solar cell module can be excellent both in reliability and in the aesthetic sense.

Described below are the photovoltaic element used in the present invention and materials for covering the photovoltaic element.

Photovoltaic Element 101

Figure 2A:
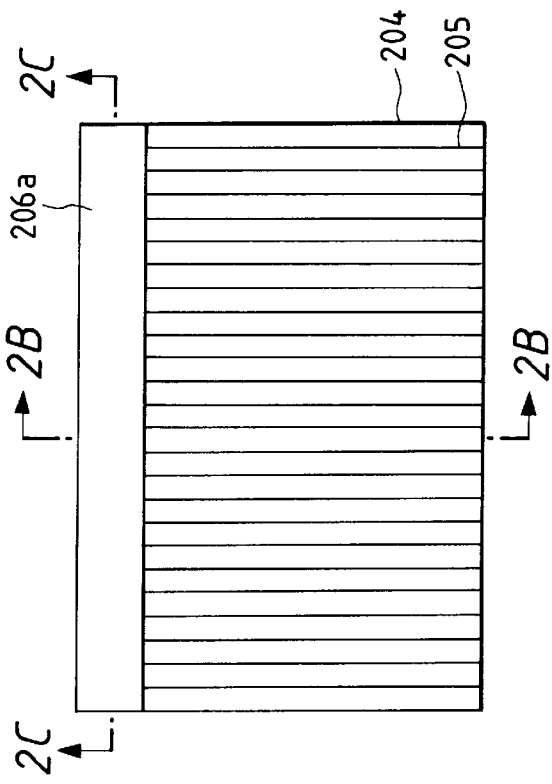
FIG. 2A is a plan view of an example of a photovoltaic element applicable to the solar cell module of the present invention.
Figure 2C:
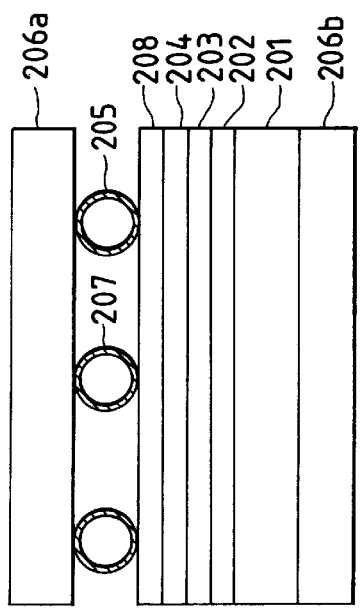
FIG. 2C is a cross-sectional view taken along the line 2C—2C of FIG. 2A.
Figure 2B:
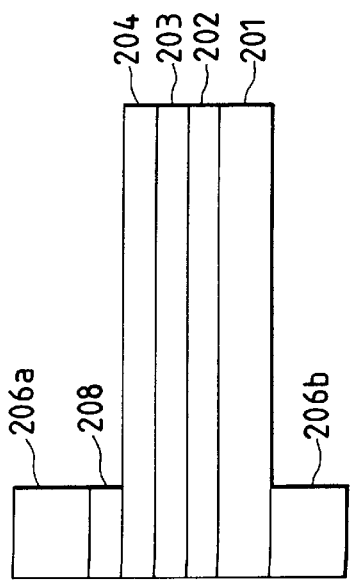
FIG. 2B is a cross-sectional view taken along the line 2B—2B of FIG. 2A.

FIGS. 2A to 2C show an example of the photovoltaic element applicable to the solar cell module according to the present invention. Reference numeral 201 designates a conductive substrate, 202 a back surface reflective layer, 203 a photoactive semiconductor layer, 204 a transparent, conductive layer, 205 a collector electrode, and 206 output terminals.

The conductive substrate 201 functions as a substrate of the photovoltaic element and also functions as a lower electrode. The conductive substrate 201 may be made of a material selected from silicon, tantalum, molybdenum, tungsten, stainless steel, aluminum, copper, titanium, a carbon sheet, a lead-plated iron sheet, and a resin or ceramic film with a conductive layer formed thereon.

As the back surface reflective layer 202 on the above-stated conductive substrate 201, there may be formed a metal layer, or a metal oxide layer, or a combination of a metal layer and a metal oxide layer. The metal layer is made, for example, of Ti, Cr, Mo, W, Al, Ag, or Ni, and the metal oxide layer is made, for example, of ZnO, $TiO_2$ or $SnO_2$. A method for forming the above metal layer and metal oxide layer is selected from the resistance heating vapor deposition method, the electron beam vapor deposition method, the sputtering method, and so on.

The photoactive semiconductor layer 203 is a section for effecting photoelectric conversion. Specific examples of materials for the photoactive semiconductor layer 203 are pn junction type polycrystalline silicon, pin junction type amorphous silicon, and compound semiconductors including $CuInSe_2$, $CuInS_2$, GaAs, $CdS/CU_2S$, CdS/CdTe, CdS/InP, and $CdTe/Cu_2Te$. The photoactive semiconductor layer is made by sheeting molten silicon or by heat treatment of amorphous silicon in the case of polycrystalline silicon; or by plasma enhanced CVD using silane gas or the like as a raw material in the case of amorphous silicon; or by ion plating, ion beam deposition, vacuum vapor deposition, sputtering, or electrodeposition in the case of the compound semiconductors.

The transparent, conductive layer 204 serves as an upper electrode of the solar cell. The transparent, conductive layer 204 is made of a material selected, for example, from $In_2O_3$, $SnO_2$ $In_2O_3$—$SnO_2$ (ITO), ZnO, $TiO_2$, $Cd_2SnO_4$, and crystalline semiconductor layers doped with a high concentration of impurities. A method for forming the transparent, conductive layer 204 is selected from resistance heating vapor deposition, sputtering, spraying, CVD, and an impurity diffusing method.

On the transparent, conductive layer, there may be provided the collector electrode 205 (grid) of a grating pattern in order to efficiently collect electric currents. Specific materials for the collector electrode 205 are, for example, Ti, Cr. Mo, W Al, Ag, Ni, Cu, Sn, and conductive pastes including a silver paste. A method for forming the collector electrode 205 is selected from sputtering with a mask pattern, resistance heating, CVD, first evaporating a metal film over the entire surface and thereafter patterning it by removing unnecessary portions by etching, directly forming the grid electrode pattern by photo-CVD, first forming a mask of a negative pattern of the grid electrode pattern and then effecting plating thereon, and printing a conductive paste. The conductive paste is usually selected from those in which fine powder of silver, gold, copper, nickel, carbon, or the like is dispersed in a binder polymer. As the binder polymer, there may be included, for example, polyester, epoxy, acrylic, alkyd, polyvinyl acetate, rubber, urethane, and phenol resins.

Finally, the positive output terminal 206a and negative output terminal 206b are attached to the collector electrode and to the conductive substrate, respectively, for taking out the electromotive force. The output terminal is attached to the conductive substrate by a method for sticking a metal member such as a copper tab thereto by spot welding or soldering. The output terminal is attached to the collector electrode by a method for electrically connecting a metal member thereto by a conductive paste 207 or solder. When attached to the collector electrode 205, an insulating member 208 is desirably provided in order to prevent the output terminal from touching the conductive metal substrate and the semiconductor layer, thereby causing short circuit.

The photovoltaic elements produced by the above techniques are connected in series or in parallel, depending upon desired voltage or electric current. When they are connected in series, the positive output terminal of one cell is connected to the negative output terminal of a next cell. When they are connected in parallel, the output terminals of the same pole are connected to each other. Different from these examples, it is also possible to integrate photovoltaic elements on an insulated substrate to obtain a desired voltage or current.

A material for the metal member used for connection of the output terminals and the elements is selected desirably from copper, silver, solder, nickel, zinc, and tin, taking account of high conductivity, the soldering property, and cost.

Fibrous Inorganic; Compound 102

Next described is the fibrous inorganic compound 102 soaked in the surface filler. First, the surface of the solar cells of amorphous silicon is covered by a plastic film in order to take full advantage of its flexibility. In this case, however, the surface is much less resistant to exterior scratching than in the case of the outermost surface being covered by glass.

The solar cell modules, particularly modules mounted on the roof or the wall of a house, are required to have flame resistance. The surface covering material, however, becomes very flammable with a large amount of transparent, organic polymer resin contained therein. On the other hand, it cannot protect the photovoltaic elements from external impact if the amount of polymer resin is small. In order to protect the photovoltaic elements sufficiently from the external environments by a small amount of the resin, transparent organic polymer resin in which the fibrous inorganic compound is soaked is used as the surface covering material.

The fibrous inorganic compound is selected specifically from nonwoven fabric of glass fiber, woven fabric of glass fiber, glass filler, and so on. Particularly, the nonwoven fabric of glass fiber is used preferably. The glass fiber fabric is expensive and hard to impregnate. When the glass filler is used, there is little increase in the scratch resistance, and it is not easy to cover the photovoltaic elements with a smaller amount of the transparent organic polymer resin. It is also desirable as to long-term use to treat the fibrous inorganic compound with a silane coupling agent or an organic titanate compound, similar to those used in the transparent organic polymer resin, in order to assure sufficient adhesiveness.

Filler 103

The transparent organic polymer resin used for the surface filler 103 is necessary for covering the unevenness of the photovoltaic elements with the resin, for protecting the photovoltaic elements from severe external circumstances such as temperature change, humidity, and impact, and for ensuring adhesion between the surface film and the elements. Therefore, it needs to be excellent in weather resistance, adhesion, filling property, heat resistance, low temperature resistance, and impact resistance. Resins satisfying these requirements include polyolefin-based resins such as ethylene-vinyl acetate copolymers (EVA), ethylene methyl acrylate copolymers (EMA), ethylene ethylacrylate copolymers (EEA) and butyral resins, urethane resins, silicone resins, and so on. Among them, the EVA copolymers are preferably used, because they have well-balanced physical properties for use in a solar cell.

Since EVA copolymers, if not crosslinked, readily undergo deformation or creep in use at high temperature because of their low thermal deformation temperature, they should desirably be crosslinked in order to enhance the heat resistance. In the case of the EVA, it is general to effect crosslinking using an organic peroxide. The crosslinking with the organic peroxide is made in such a way that free radicals produced from the organic peroxide draw hydrogen and halogen atoms out of the resin to form C—C bonds. The known methods for activating the organic peroxide include thermal decomposition, redox decomposition, and ionic decomposition. In general, the thermal decomposition method is favorably adopted. Specific examples of the chemical structure of the organic peroxide are roughly classified into hydroperoxide, dialkyl (allyl) peroxide, diacyl peroxide, peroxy ketal, peroxy ester, peroxy carbonate, and ketone peroxide.

An amount of the organic peroxide added is in the range of 0.5 to 5 parts by weight per 100 parts by weight of the filler resin.

When the above organic peroxide is used in combination with the filler, the crosslinking and thermocompression bonding can be achieved under heating and pressure application. The heating temperature and time can be determined depending upon the thermal decomposition temperature characteristics of the respective organic peroxides. In general, application of heat and temperature is stopped at the temperature reaches 90%, more preferably not less than 95%. The gel percentage of the filler by this is preferably not less than 80%. The gel percentage herein is given by the following equation.

Gel percentage=(weight of the undissolved/original weight of sample)×100 (%)

Namely, when the transparent organic polymer resin is extracted with a solvent of xylene or the like, the part gelled by crosslinking is not eluted but only the non-crosslinked sol part is eluted. The gel percentage of 100% means completion of perfect crosslinking. Only the undissolved gel part can be obtained by taking out the sample remaining after the extraction and evaporation of xylene therefrom.

If the gel percentage is less than 80%, the resultant resin will have lowered heat resistance and creep resistance and will pose a problem in use under high temperature, for example, in summer.

For efficiently advancing the above crosslinking reaction, it is desired to use triallyl isocyanurate (TAIC), which is called a crosslinking assistant. An amount of the crosslinking assistant added is normally in the range of 1 to 5 parts by weight per 100 parts by weight of the filler resin.

The material of the filler used in the present invention is excellent in weather resistance, but an ultraviolet absorbing agent may also be added in order to further enhance weather resistance or in order to protect the layer located below the filler. The ultraviolet absorbing agent can be selected from the known compounds and is preferably selected from low-volatile ultraviolet absorbers, taking account of use environments of the solar cell modules. If a light stabilizer is also added together with the ultraviolet absorber, the filler will become more stable to light. Specific chemical structures of ultraviolet absorbers are roughly classified into salicylic acid-based, benzophenone-based, benzotriazole-based, and cyanoacrylate-based absorbers. It is preferred to add at least one of these ultraviolet absorbers.

As a method for imparting weather resistance other than the use of the above ultraviolet absorber, it is known that use of a hindered-amine-based light stabilizer is available. The hindered-amine-based light stabilizer does not absorb ultraviolet light, different from the ultraviolet absorber, but it can demonstrate a great synergistic effect when used together with the ultraviolet absorber. An amount of the stabilizer added is normally approximately 0.1–0.3 part by weight per 100 parts by weight of the resin. There are, of course, light stabilizers other than the hindered-amine-based stabilizers, but the most of them are colored and thus are not desirable for use in the filler of the present invention.

Further, an antioxidant may be added for improving the thermal resistance and thermal workability. An amount of the antioxidant added is preferably 0.1–1 part by weight per 100 parts by weight of the resin. Chemical structures of antioxidants are roughly classified into monophenol-based, bisphenol-based, polymer-type-phenol-based, sulfur-based, and phosphoric-acid-based inhibitors.

If the solar cell modules are assumed to be used under severe circumstances, it will be preferable to enhance the adhesive strength between the filler and the photovoltaic elements or the surface film. The adhesive strength can be enhanced by adding a silane coupling agent or an organic titanate compound to the filler. An amount of the additive is preferably 0.1 to 3 parts by weight per 100 parts by weight of the filler resin and more preferably 0.25 to 1 part by weight per 100 parts by weight of the filler resin. Moreover, addition of the silane coupling agent or the organic titanate compound into the transparent organic polymer is also effective for enhancing the adhesive strength between the transparent organic/polymer compound and the fibrous inorganic compound therein.

On the other hand, the surface filler needs to be transparent in order to prevent decrease in the quantity of light reaching the photovoltaic elements as much as possible. Specifically, the light transmittance thereof is preferably 80% or more and more preferably 90% or more in the visible light wavelength region from 400 nm to 800 nm. For facilitating incidence of light from the atmosphere, the refractive index of the filler at 25° C. is preferably 1.1 to 2.0 and more preferably 1.1 to 1.6.

Surface Resin Film 104

Since the surface resin film 104 employed in the present invention is located in the outermost layer of the solar cell module, it needs to exhibit long-term reliability under outdoor exposure of the solar cell module, including the weather resistance, pollution resistance, and mechanical strength. The resin film used in the present invention includes a fluororesin film, an acrylic resin film, and so on. Among them, the fluororesin films are favorably used because of their excellent weather resistance and pollution resistance. Specific examples of the fluororesins are polyvinylidene fluoride resins, polyvinyl fluoride resins, tetrafluoroethylene-ethylene copolymers, and so on. The polyvinylidene fluorid resins are excellent in terms of weather resistance, while the tetrafluoroethylene-ethylene copolymers are excellent in terms of weather resistance, mechanical strength, and transparency.

For improving the adhesion to the filler, the surface film is desirably subjected to a surface treatment such as corona treating, plasma treating, ozone treating, UV irradiation, electron beam irradiation, or flame treating. Specifically, the wetting index of the surface on the photovoltaic element side is preferably 34 dyne to 45 dyne. If the wetting index is not more than 34 dyne, the adhesive strength will not be sufficient between the resin film and the filler, and separation will occur between the filler and the resin film. Further, when the resin film is a tetrafluoroethylene-ethylene copolymer film, it is difficult to achieve the wetting index over 45 dyne.

If the resin film is an oriented film, cracks will appear. In the case wherein the edge portions of the solar cell module are bent as in the present invention, the film would be broken at the bent portions so as to promote peeling off of the covering material and intrusion of water in those portions, thereby degrading the reliability. For this reason, the resin film is desirably a non-oriented film. Specifically, the tensile elongations at break according to ASTM D-882 testing method are preferably 200% to 800%, both in the longitudinal direction and in the transverse direction.

Back Surface Filler 105

The back surface filler 105 is provided in order to achieve adhesion between the photovoltaic elements 101 and the insulating film 106 on the back surface. Preferred materials for the back surface filler 105 are those capable of ensuring sufficient adhesion to the conductive substrate, excellent in the long-term durability, resistant to thermal expansion and thermal contraction, and flexible. A suitable material is selected from hot melt materials such as EVA, ethylene-methyl acrylate copolymer (EMA), ethylene-ethyl acrylate copolymers (EEA), polyethylene, or polyvinyl butyral, a two sided adhesive tape, an epoxy adhesive having flexibility, and so on. In addition, for enhancing the adhesive strength to the support member and the insulating film, the surface of these adhesives may be coated with a tackifier resin. These fillers are often the same materials as the transparent polymer resins used for the surface filler 103. For simplification, it is also possible to use a material in which the adhesive layer described above is preliminarily laid integrally on the both sides of the insulating film.

Insulating Film 106

The insulating film 106 is necessary for maintaining the electrical insulation between the conductive metal substrate of the photovoltaic element 101 and the outside. Preferred materials are those capable of ensuring the sufficient electrical insulation to the conductive metal substrate, excellent in long-term durability, resistant to thermal expansion and thermal contraction, and flexible. A stable film is selected from polyamide, polyethylene terephthalate, polycarbonate, and so on.

Support Member 107

To the outside of the back surface covering film, the support member 107 is stuck in order to increase the mechanical strength of the solar cell module, in order to prevent distortion or warpage due to temperature change, or in order to realize the solar cell module which functions also as a roof material. A preferred material for the support member 107 is selected, for example, from a painted galvanized iron sheet covered by an organic polymer resin with excellent weather resistance and rust resistance, a plastic sheet, an FRP (glass fiber reinforced plastic) sheet, and so on.

Formation of Module

Figure 3:
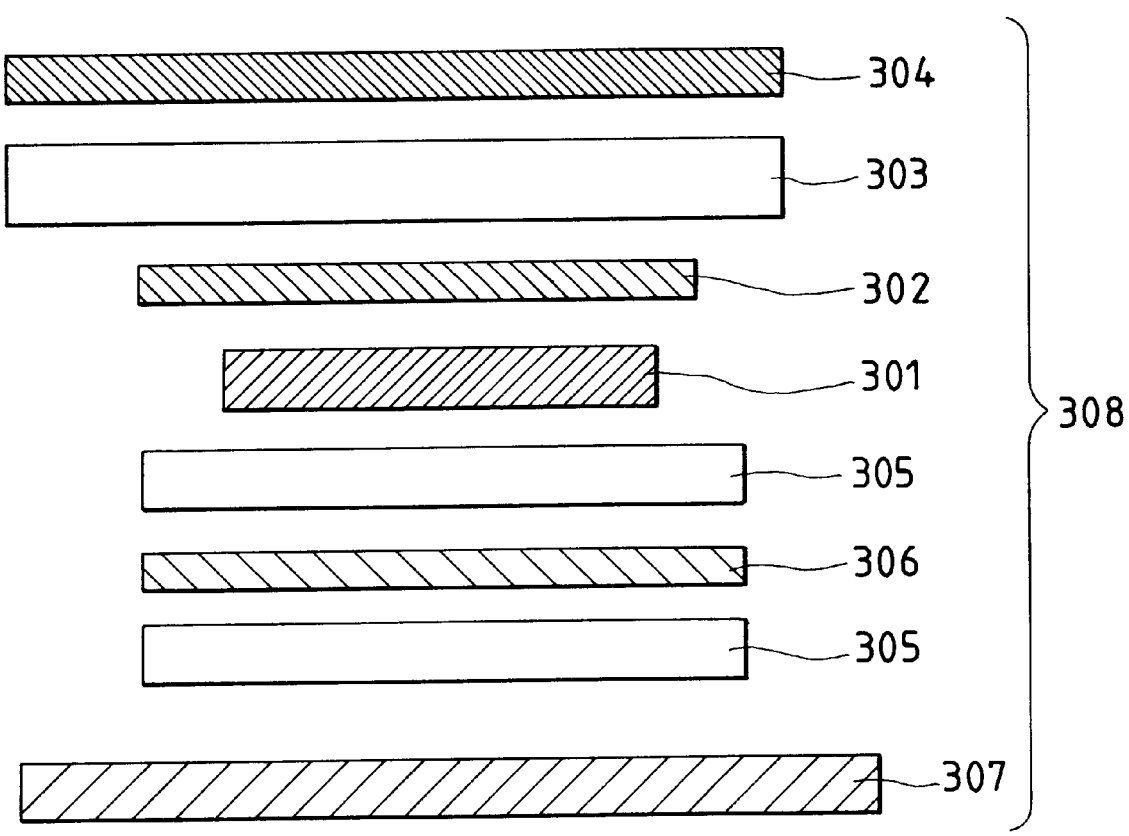
FIG. 3 is a view showing layers stacked during production of a solar cell module.

FIG. 3 is a drawing showing a stacking configuration of layers which form the solar cell module. Specifically, the photovoltaic element 301, inorganic filler compound 302, surface filler 303, surface resin film 304, back surface filler 305, insulating film 306, and support member 307 are stacked in the order illustrated in the figure or in the reverse order and are pressed under heat by a vacuum laminating apparatus, thereby obtaining the solar cell module 308. The heating temperature and heating period during the pressing are determined to be a temperature and a period sufficient to progress the crosslinking reaction.

Since the step of encapsulating the photovoltaic element is carried out at the same time as the step of fixing the encapsulated photovoltaic element to the support member, a low-cost solar cell module can be obtained. Namely, the covering step of the solar cell module can be conducted easily by the simple apparatus, and the productivity is thus increased.

The solar cell module 308 produced in this way is processed so as to have the bent portion by the press molding machine, the roller former molding machine, or the bender molding machine, thereby obtaining the solar cell module of the present invention.

The solar cell modules of the present invention are used together with a power converting device, so as to compose a power generation system. The power converting device performs such control as to always maximize the output from the solar cell modules. The power generation system may have an interconnecting function to a commercial power system.

EXAMPLES

Example 1-1

[Photovoltaic element]

First, amorphous silicon (a-Si) solar cells (photovoltaic elements) are produced. The producing procedures will be described referring to FIGS. 2A to 2C.

On a cleaned stainless steel substrate 201, an Al layer (5000 Å thick) and a ZnO layer (5000 Å thick) are successively formed by sputtering to form a back surface reflective layer 202. Then a tandem type a-Si photoelectric conversion semiconductor layer 203 is formed in the layer structure of n-layer 150 Å thick/i-layer 4000 Å thick/p-layer 100 Å thick/n-layer 100 Å thick/i-layer 800 Å thick/p-layer 100 Å thick by making the n-type a-Si layers from a gaseous mixture of $SiH_4$, $PH_3$, and $H_2$, the i-type a-Si layers from a gaseous mixture of $SiH_4$ and $H_2$, and the p-type microcrystalline Si (i.e., $\mu c$-Si) layers from a gaseous mixture of $SiH_4$, $BF_3$ and $H_2$ by the plasma CVD method. Next, $In_2O_3$ thin film (700 Å thick) is formed as a transparent, conductive layer 204 by evaporating indium (In) in an $O_2$ atmosphere by the resistance heating method. Further, a grid electrode 205 for collection of current is formed by screen printing of a silver paste. In a final step, a copper tab as a negative terminal 206b is attached to the stainless-steel substrate with solder 207, and a tape of tin foil as a positive output terminal 206a is attached to the collector electrode 205 with solder 207 so as to form the output terminals, thus obtaining a photovoltaic element.

[Cell block]

Figure 5A:
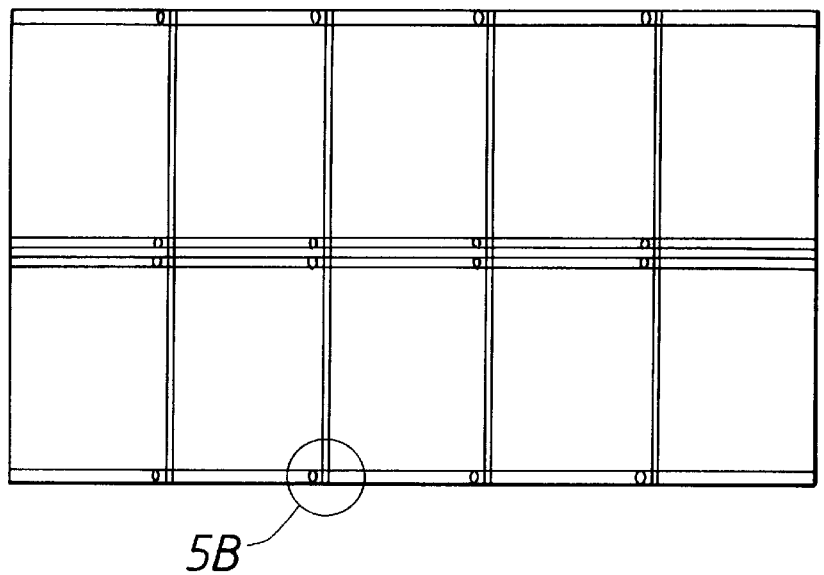
FIG. 5A is a plan view of an example of a cell block applicable to the solar cell module of the present invention.
Figure 5B:
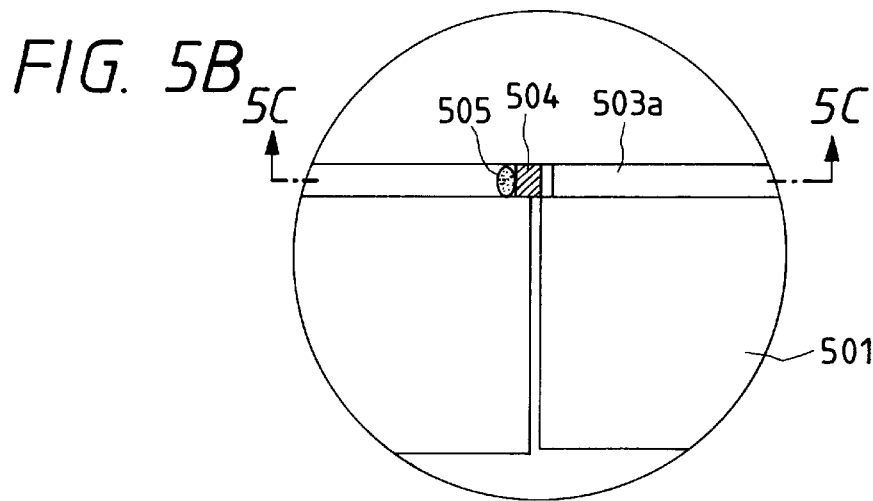
FIG. 5B is an enlarged view of the portion 5B of FIG. 5A.
Figure 5C:
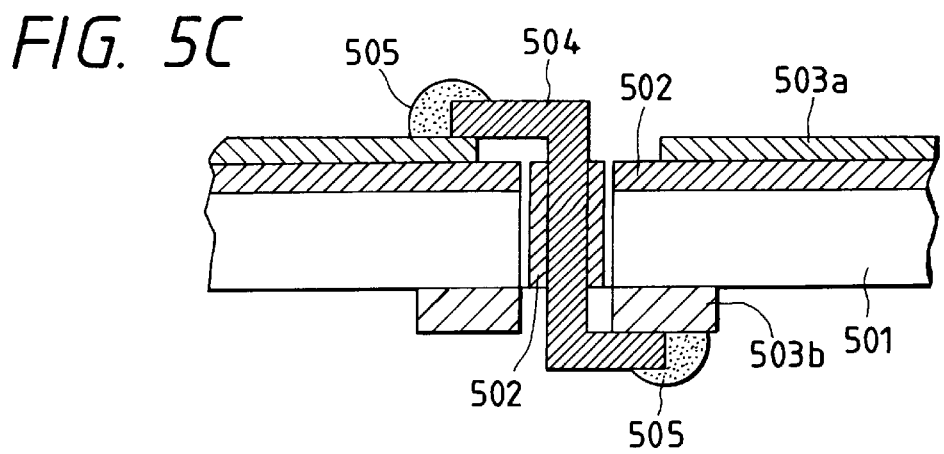
FIG. 5C is a cross-sectional view taken along the line 5C—5C of FIG. 5B.

A method for producing a solar cell block by connecting the cells described above in the 5 serial×2 parallel configuration will be described referring to FIGS. 5A to 5C.

First produced are two sets of 5-series cell blocks. Five cells are arranged on a horizontal line, and thereafter the positive terminal, 503a of one of adjacent cells is connected through copper tab 504 with solder 505 to the negative terminal 503b of the other cell. By this, the five cells are connected in series, thereby forming a series-connected cell block. The copper tab connected to the output terminal of the end cell is routed to the back surface so as to form a back surface collector electrode to permit the output to be taken out through a hole in the back surface covering layer as described hereinafter. In FIG. 5C, numeral 502 designates insulating films for electric isolation. Then two series-connected cell blocks are juxtaposed and the same poles of the back surface collector electrodes of the series-connected cell blocks are connected in parallel using copper tabs and solder. A solar cell block is completed in this way.

[Formation of module]

Figure 6A:
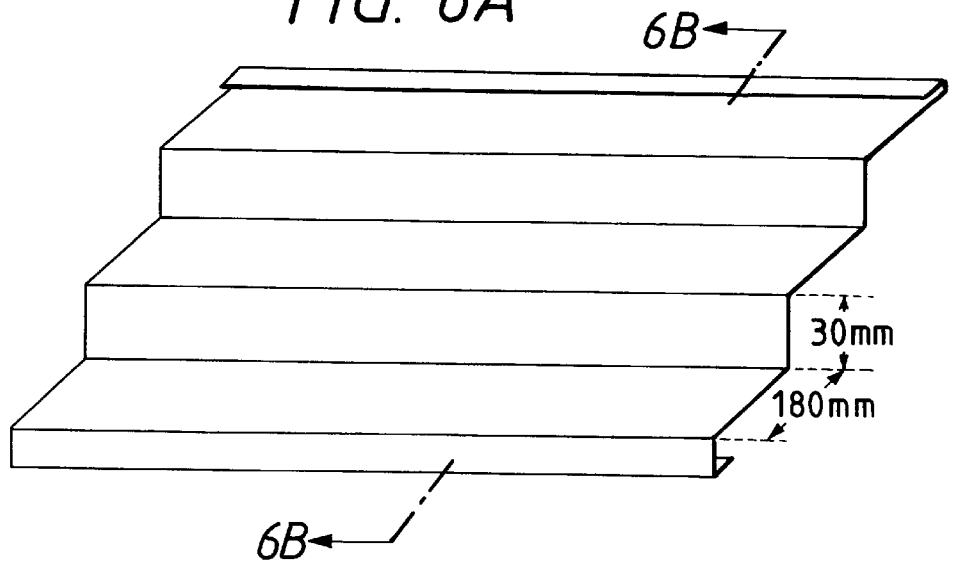
FIG. 6A is a perspective view of a solar cell module according to the present invention.
Figure 6B:
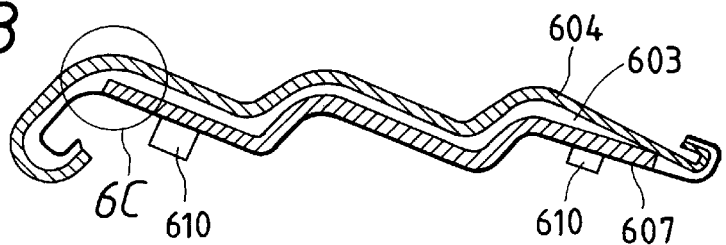
FIG. 6B is a cross-sectional view taken along the line 6B—6B of FIG. 6A.
Figure 6C:
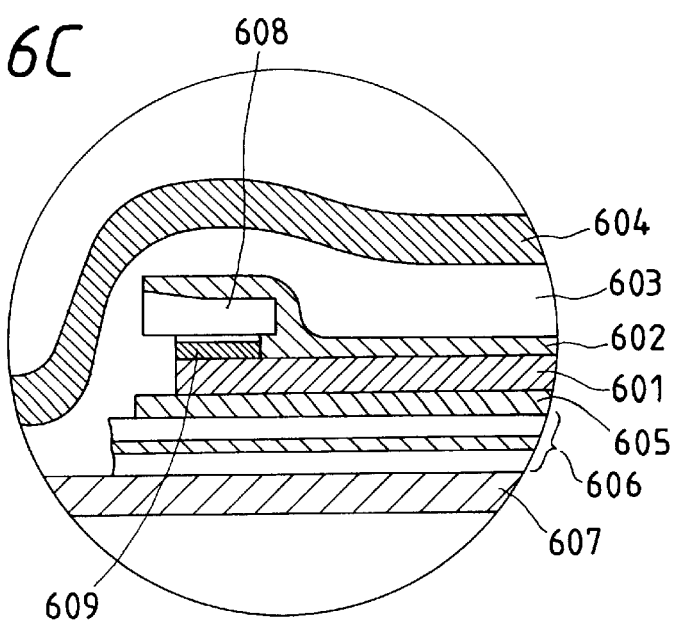
FIG. 6C is an enlarged view of the portion 6C of FIG. 6B.

FIGS. 6A to 6C show a method for forming the solar cell module by covering the photovoltaic elements (cell blocks) connected in parallel and in series. The solar cell module is produced by preparing cell block 601, fibrous inorganic compound (40 g/m$^2$) 602, surface filler 603, surface resin film 604, fibrous inorganic compound (20 g/m$^2$) 605, back surf ace laminate film 606, and support member 607 and stacking them in the order of FIG. 6C. A decorative tape 608 is laid on the positive output terminal in order to conceal the positive output terminal 609 of the cell block 601.

<Fibrous inorganic compound 602>

Prepared is a nonwoven fabric of glass fiber having the basis weight of 40 g/M$^2$, the thickness of 200 μm, and the fiber diameter of 10 μm and containing 4.0% of acrylic resin as a binder.

<Fibrous inorganic compound 605>

Prepared is a nonwoven fabric of glass fiber having the basis weight of 20 g/m$^2$, the thickness of 100 μm, and the fiber diameter of 10 μm and containing 4.0% of acrylic resin as a binder.

<Surface filler 603>

Prepared is an EVA sheet of 460 μm in thickness formulated by blending an ethylene-vinyl acetate copolymer (25 wt % vinyl acetate), a crosslinking agent, an ultraviolet absorber, an antioxidant, and a light stabilizer.

<Surface resin film 604>

A non-oriented ethylene-tetrafluoroethylene (ETFE) film of 50 μm in thickness is prepared as a surface resin film. A surface of the film to contact the filler 603 is preliminarily processed by plasma treating.

<Back surface laminate film 606>

Prepared as the laminate film 606 is a laminate film of the total thickness 500 μm obtained by integrally laminating an ethylene-ethyl acrylate copolymer (EEA) (200 μm thick) and a polyethylene (PE) resin (25 μm thick) as an adhesive layer and a biaxially oriented polyethylene terephthalate film (PET) (50 μm thick) as an insulating film in the order of EEA/PE/PET/PE/EEA.

<Support member 607>

Prepared as the support member 607 is a steel sheet obtained by coating one surface of a galvalium sheet ion (an aluminum-zinc alloy plated steel sheet of aluminum 55%, zinc 43.4%, and silicon 1.6%) with a polyester-based paint and the other surface with a polyester-based paint containing glass fibers. The thickness of the steel sheet is 400 μm.

<Decorative tape 608>

As the decorative tape 608, is prepared a film of EVA/PET/EVA obtained by integrally laminating EVA films (460 μm thick) on the both sides of polyethylene terephthalate (PET) film (50 μm thick and black colored).

<Formation of module>

This lamination is heated in vacuum using a laminating apparatus of the single vacuum system, thereby forming a flat-plate solar cell module. The vacuum conditions include an evacuation rate of 76 Torr/sec and a vacuum of 5 Torr for 30 minutes. After that, the laminating apparatus is put in a hot-air oven at 160° C. to be heated for 50 minutes. The EVA is then maintained at 140° C. or more for 15 minutes or more. This causes the EVA to be melted and crosslinked.

[Processing with roller former]

Figure 4A:
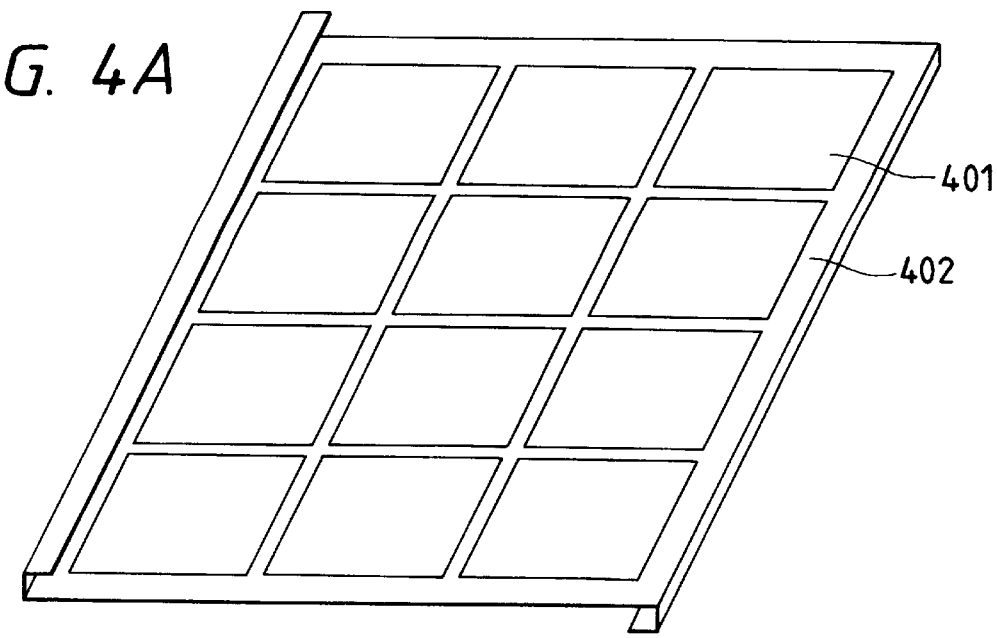
FIG. 4A is a perspective view of a solar cell module, the edges of which are bent.

Next, as shown in FIG. 4A, two opposing edges of the solar cell module are bent by the roller former so as to form seam-joint portions to realize the engaging function of roof material. In this case, the solar cell module is bent while preventing the rollers from touching the photovoltaic element portions.

[Processing with bender]

Figure 4B:
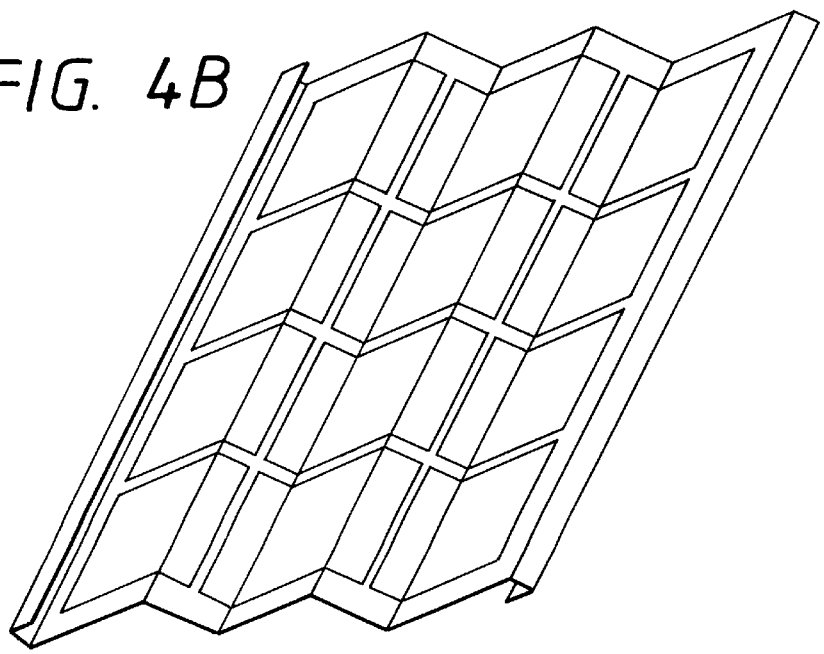
FIG. 4B is a perspective view of the finished solar cell module.

Next, as shown in FIG. 4B, the support member is bent by the bender, irrespective of presence or absence of the photovoltaic element.

Figure 7:
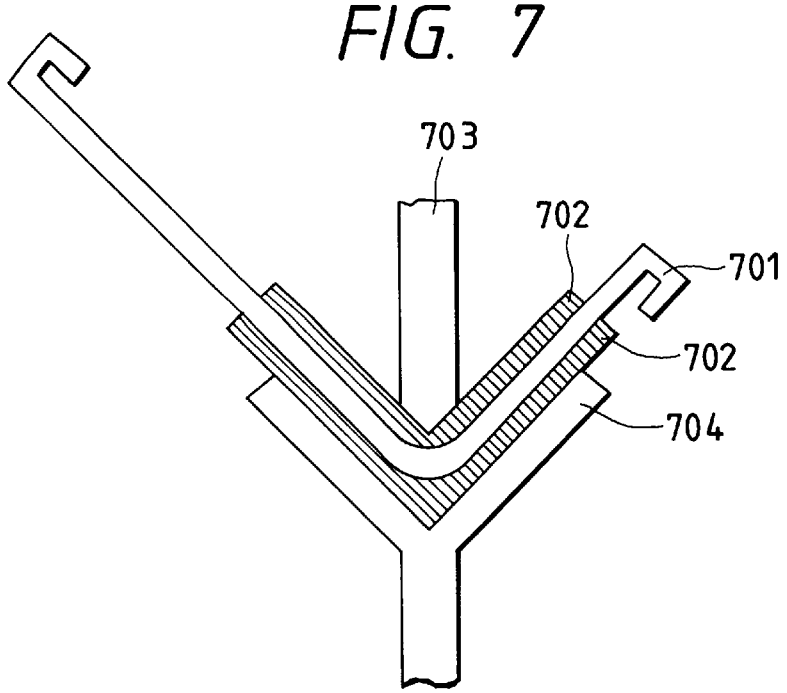
FIG. 7 is a cross-sectional view of the solar cell module under bending with a bender.

FIG. 7 is a drawing showing the details of the bending by the bender. A urethane sheet 702 is used as a buffer material between a lower blade 704 of the bender and the solar cell module 701 and between an upper blade 703 of the bender and the solar cell module 701. The thickness of the urethane sheet 702 used is 2 mm, and the clearance between the upper blade 703 and the lower blade 704 is 8 mm.

The bending is done so that the processed shape has the passed width of 180 mm and the height of 30 mm.

In the last step, wires for taking the power out are attached to the back surface of the solar cell module. The support member is preliminarily perforated in terminal-out portions of the solar cell group, and the positive and negative output terminals are taken out through the holes. Further, each terminal-out portion is provided with a polycarbonate junction box 610 for insulation protection and waterproofness. Cables used are cable lines each having a connector at the tip.

Example 1-2

The solar cell module is produced in the same manner as in Example 1-1 except that the blade of the bender having the radius of curvature of 300 mm is used as means for reducing the pressure during bending of regions above the photovoltaic elements by the bender.

Example 1-3

Figure 8:
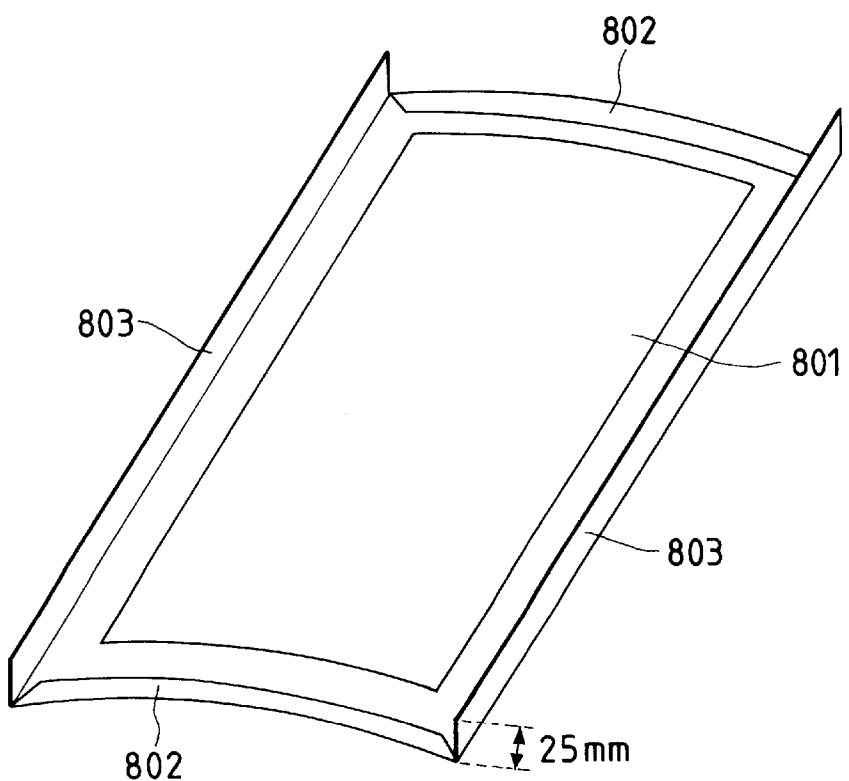
FIG. 8 is a perspective view of a solar cell module according to the present invention.

The solar cell module of Example 1-3 is shown in FIG. 8.

The photovoltaic elements are made in the same manner as in Example 1-1 and the other steps are described below.

<Cell block 801>

The five cells described above are connected in series to produce a solar cell block 801. The method for producing the block is the same as in Example 1-1.

<Formation of module>

The flat-plate solar cell module is made of the above five-series solar cell block in the same manner as in Example 1-1.

<Bending of edge portions>

The four corners of the flat-plate solar cell module are cut by corner shears. After that, the shorter edges are folded 180° to form shorter-edge bent portions 802 in order to reinforce the shorter edges; the longer edges are bent 90° on the light-receiving side by the bender to form longer-edge bent portions 803. The height of upright parts of the longer-edge bent portions 803 is 25 mm.

<Press processing>

The bent portion is formed by the press processing shown in FIG. 9. The press processing is conducted by placing the solar cell module 901 between a lower mold 904 having a projected portion and an upper mold 903 having a depressed portion. On that occasion, an urethane sheet 902 having a thickness of 5 mm is interposed between the molds and the solar cell module in order to reduce the vertical pressure exerted on the photovoltaic elements by the press. Namely, the stacking order in the press processing is the lower mold 904/the urethane sheet 902/the solar cell module 901/the urethane sheet 902/the upper mold 903.

Example 1-4

Figure 10A:
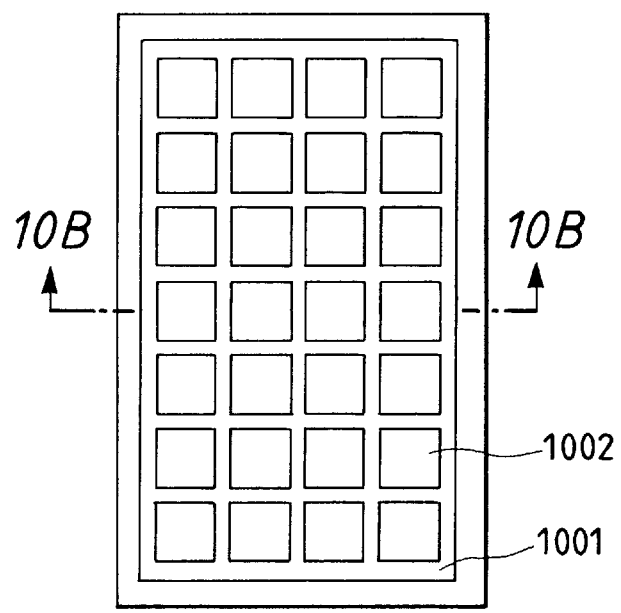
FIG. 10A is a plan view of a solar cell module according to the present invention.
Figure 10B:
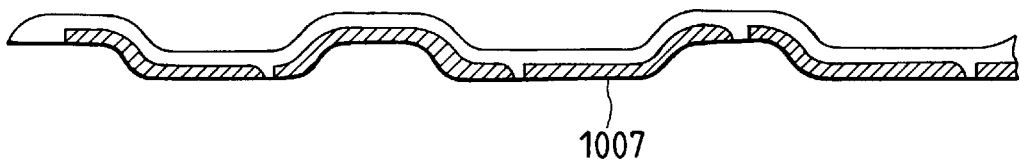
FIG. 10B is a cross-sectional view taken along the line 10B—10B of FIG. 10A.

The solar cell module of Example 1-4 is shown in FIGS. 10A and 10B.

The flat-plate solar cell module is made in the same manner as in Example 1-3.

<Press processing>

Depressed portions 1002 are formed by press processing. The solar cell module is pressed while being interposed between a lower mold having depressed portions and an upper mold having projected portions, the depressed portions and projected portions being arrayed in a matrix of 4×7 squares each having the size of 150 mm ×150 mm as shown in FIGS. 10A and 10B. On that occasion, an urethane sheet of 5 mm in thickness is interposed between the molds and the solar cell module in order to reduce the vertical pressure exerted on the photovoltaic elements by the press. Namely, the stacking order in the press processing is the lower mold/the urethane sheet/the solar cell module/the urethane sheet/the upper mold.

Comparative Example 1-1

The solar cell module is produced in the same manner as in Example 1-1 except that the urethane sheet for reducing the pressure exerted by the bender is not used.

Comparative Example 1-2

The solar cell module is produced in the same manner as in Example 1-3 except that the urethane sheet for reducing the pressure exerted by the press is not used.

Comparative Example 1-3

The solar cell module is produced in the same manner as in Example 1-4 except that the urethane sheet for reducing the pressure exerted by the press is not used.

Comparative Example 1-4

The cell block is formed in the same manner as in Example 1-1. Steps after the formation of cell block will be described below in detail.

[Formation of module]

Figure 11:
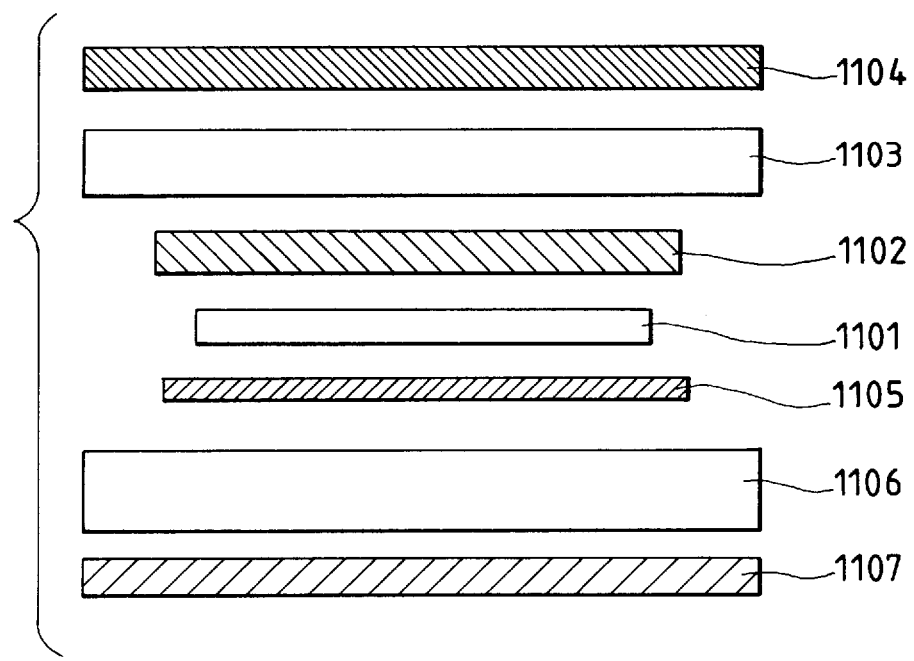
FIG. 11 is a view showing layers stacked in a solar cell module of a comparative example.

The solar cell module is produced without using the support member in Example 1-1. Specifically, as shown in FIG. 11, the solar cell module is made by preparing a cell block 1101, a fibrous inorganic compound (40 g/m$^2$) 1102, a transparent organic polymer resin 1103 on the light-receiving side, a surface resin film 1104, a fibrous inorganic compound (20 g/m$^2$) 1105, a back surface adhesive 1106, and an insulating film 1107 and stacking them as illustrated.

<Back surface adhesive 1106>

The back surface adhesive used is the same resin as the organic polymer resin on the light-receiving side.

<Insulating film 1107>

The insulating film used is a polyethylene terephthalate film (PET) (50 μm thick).

[Sticking]

The flat-plate solar cell module after the formation of module is stuck to a steel sheet prepared as a roof material preliminarily processed as to have a bent portion, thus making the solar cell module.

The solar cell modules of the respective examples are evaluated as to the following items. The results are shown in Table 1 below.

TABLE 1

| | Initial | | After hi-temp and hi-humid test | | After temp/humid cycle test | | |
|---|---|---|---|---|---|---|---|
| | workability | external appearance | external appearance | conversion efficiency | external appearance | conversion efficiency | Scratch resistance |
| Ex 1-1 | ⊚ | ⊚ | ⊚ | ⊚ | ⊚ | ⊚ | ⊚ |
| Ex 1-2 | ⊚ | ⊚ | ⊚ | ⊚ | ⊚ | ⊚ | ⊚ |
| Ex 1-3 | ⊚ | ⊚ | ⊚ | ⊚ | ⊚ | ⊚ | ⊚ |
| Ex 1-4 | ⊚ | ⊚ | ⊚ | ⊚ | ⊚ | ⊚ | ⊚ |
| Comp Ex 1-1 | ⊚ | X | X | Δ | X | Δ | ⊚ |
| Comp Ex 1-2 | ⊚ | X | X | Δ | X | Δ | ⊚ |
| Comp Ex 1-3 | ⊚ | X | X | Δ | X | Δ | ⊚ |
| Comp Ex 1-4 | X | ⊚ | X | ⊚ | X | ⊚ | ⊚ |

Workability

The workability is examined from aspects of processing speed and operability on the occasion of formation of the solar cell module processed so as to have the bent portion in a part or the whole of the support member including the photovoltaic elements. The results of examination are shown in Table 1, based on the following criteria.

⊚ The time necessary for processing one module is 1 sec to 30 sec, and the module is thus considered to have very high mass-productivity and good operability.

○: The time necessary for processing one module is 30 sec to 60 sec, and the module is thus considered to be of slightly inferior mass-productivity and operability but to be mass-producible.

x: The time necessary for processing one module is longer than 60 sec, and the module is considered to have poor mass-productivity and operability and to be incapable of being mass-produced.

Initial external appearance

The solar cell modules having the bent portion (in the final form) are evaluated as to the initial external appearance, including failure in filling and flaws on the surfaces of the solar cells. The evaluation results are shown in Table 1, based on the following criteria.

⊚: No defect is present in the external appearance.

○: Some defects are present in the external appearance but pose no problem in practical use.

x: Failure in filling and flaws on the surface are extreme and thus the defects are very large in the external appearance.

If any other defect is observed, a comment is given.

High temperature and high humidity test

The solar cell modules are placed under the circumstance of 85° C./85% (relative humidity) for 3000 hours and thereafter the solar cell modules are taken out. Change of appearance is observed visually. Further, the conversion efficiency is measured under irradiation of light AM 1.5: 100 MW/Cm$^2$, and a change rate is calculated from the initial value before the test. The evaluation results are shown in Table 1, based on the following criteria.
(Appearance)
○: No defect is present in the external appearance.
Δ: Some defects are present in the external appearance but pose no problem in practical use.
x: Considerable exfoliation or the like appears and defects are extremely large in the external appearance.
(Conversion efficiency)
○: The change of conversion efficiency is less than 1.0%.
○: The change of conversion efficiency is not less than 1.0% and less than 3.0%.
Δ: The change of conversion efficiency is not less than 3.0% and less than 5.0%.
x: The change of conversion efficiency is not less than 5.0%.

Temperature/humidity cycle test

The solar cell modules are subjected to 100 temperature/humidity cycle tests of −40° C./0.5 hour: 85° C./85% (relative humidity)/20 hours, and thereafter the solar cell modules are taken out. Change of external appearance is observed visually. The conversion efficiency is measured under irradiation of light AM 1.5: 100 mW/Cm$^2$, and the change rate is calculated from the initial value before the test. The evaluation results are shown in Table 1, based on the following criteria.
(Appearance)
○: No defect is present in the external appearance.
Δ: Some defects are present in the external appearance but pose no problem in practical use.
x: Considerable exfoliation or the like appears and defects are extremely large in the external appearance.
(Conversion efficiency)
◎: The change of conversion efficiency is less than 1.0%.
○: The change of conversion efficiency is not less than 1.0% and less than 3.0%.
Δ: The change of conversion efficiency is not less than 3.0% and less than 5.0%.
x: The change of conversion efficiency is not less than 5.0%.

Scratch resistance

Figure 12:
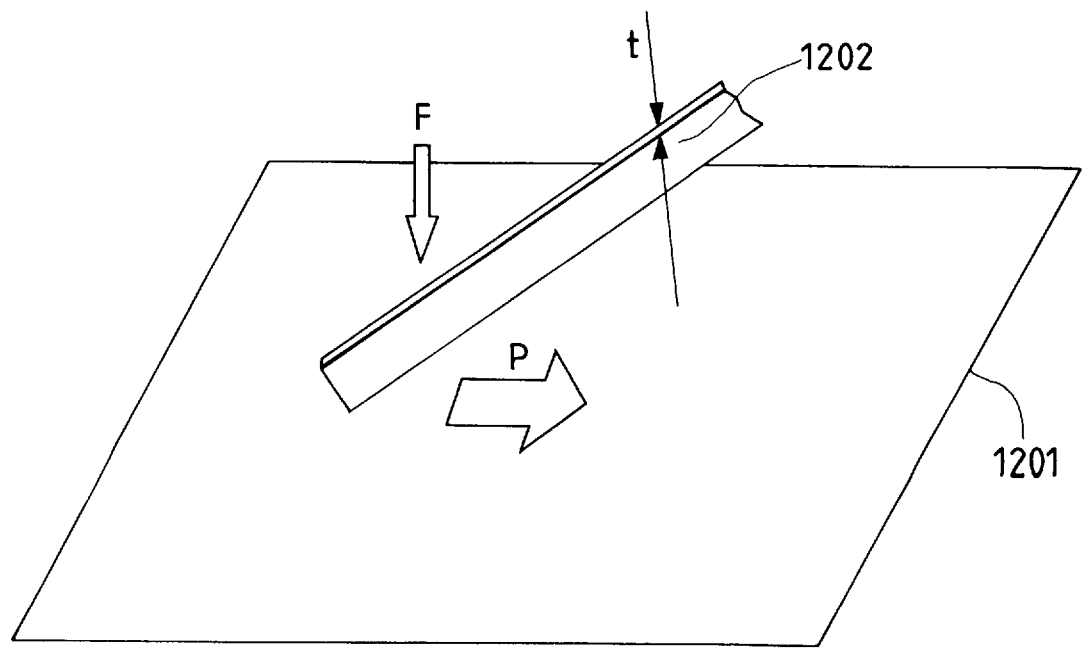
FIG. 12 is a schematic view showing a scratch resistance test.

By the method as shown in FIG. 12, a portion which seems to, have the largest unevenness in the surface of a solar cell module 1201 mounted on a metal member is scratched under the weight of 2 pounds and 5 pounds with test blade 1202. The solar cell modules are evaluated as to whether the surface covering material subjected to the scratch can maintain insulation from the outside. Determination is made in the following manner: the module is soaked in an electrolytic solution of the conductivity of 3000 Ω.cm, and the voltage of 2200 V is applied between the element and the solution. If a leak current exceeds 50 μA, the module is determined to be a reject. The evaluation results are given in Table 1, based on the following criteria.
◎: Acceptance in the 5-pound test
○: Acceptance in the 2-pound test
x: Rejection in the 2-pound test.

As apparent from Table 1, the solar cell modules of the examples of the invention demonstrate excellent workability and sufficient mass-productivity. As for the initial appearance of the final form, they have no such defect as failure in filling, whitening, or surface film flaw and are sufficiently excellent in the aesthetic sense and design as a building material. Further, since the pressure exerted on the photo- voltaic elements is reduced, the solar cell modules of the examples of the present invention are excellent not only in the initial electrical characteristics, but also in those after the high temperature and high humidity test and after the temperature/humidity cycle test, showing little change of conversion efficiency, less than 1% in either case. Therefore, the reliability is sufficient as a solar cell module. Further, there is no change in the external appearance after the various tests, so that the appearance is also good. As for the scratch resistance, all the modules of the examples of the invention pass the 5-pound test and thus have sufficient resistance against scratching from the outside. Namely, all the solar cell modules shown in the examples are building materials having the workability equivalent to that of the ordinary steel sheets, having the design property satisfying the needs for the roof materials and wall materials, and being excellent in the aesthetic sense. Further, they also have long-term reliability.

On the other hand, Comparative Examples 1-1, 1-2, and 1-3 demonstrate excellent workability equivalent to that of the examples. However, Comparative Example 1-1 has great damage of the photovoltaic elements because the regions above the photovoltaic elements are directly pressed by the blade of the bender in processing with the bender. Thus, the module of Comparative Example 1-1 shows a great lowering in conversion efficiency. As to the initial appearance of Comparative Example 1-1, much whitening is observed in the surface covering material. The whitening becomes worse after the various tests, whereby the conversion efficiency is further lowered.

In Comparative Examples 1-2 and 1-3, the great damage is also seen in the elements because of the high pressure exerted on the photovoltaic elements on the occasion of press processing, so that lowering in conversion efficiency occurs. Since the mold directly touches the surface, flaws are formed in the surface of solar cell module. Particularly, large flaws are formed in the portions where the edge of the mold contacts, whereby separation (peeling) is observed from such portions after the environment test.

Next, in Comparative Example 1-1 where the flat-plate solar cell module after module formation is stuck to the steel sheet as the roof material preliminarily processed, so as to have the bent portion, the number of operation steps increases, and the workability is thereby degraded. In the high temperature and high humidity test, peeling off occurs at the interface of the adhesive stuck later, thus exhibiting great defects in appearance.

Example 2-1

The flat-plate solar cell module is made in the same manner as in Example 1-1, except that the back surface laminate film 606 is replaced by a lamination film of the total thickness 550 μm obtained by integrally stacking an ethylene-vinyl acetate copolymer (vinyl acetate 25 wt % and the thickness 225 μm) as an adhesive layer, which is the same resin as the organic polymer resin on the light-receiving side, and a biaxially oriented polyethylene terephthalate film (PET) (100 μm thick) as an insulating film in the stacking order of EVA/PET/EVA.

[Processing with roller former]

Then the edge portions of the solar cell module are bent in the regions not including the photovoltaic elements by the roller former molding machine, as shown in FIG. 4A. In this way, the solar cell module is formed while preventing the rollers from touching the photovoltaic element portions.

[Processing]

Then the support member is bent by the press molding machine, irrespective of presence or absence of the photovoltaic element, as shown in FIG. 4B. The press processing is done by placing the solar cell module between the lower mold having the projected portion and the upper mold having the depressed portion. At this time the press conditions are adjusted so that the peak strain of the flexible substrate of the photovoltaic element is 0.6% (residual strain 0.4%).

In the last step, wires for taking the power out are attached to the back surface of the solar cell module. The support member is preliminarily perforated in terminal-out portions of the solar cell group, and the positive and negative output terminals are taken out through the holes. Further, each terminal-out portion is provided with a polycarbonate junction box for insulation protection and waterproofness. Cables used are cable lines each having a connector at the tip.

Example 2-2

The press conditions are modified from those in Example 2-1 so that the peak strain of the flexible substrate of the photovoltaic element is 0.3% (residual strain 0.1%). The solar cell module is produced in the same manner as in Example 2-1 except for the press conditions.

Example 2-3

The solar cell module is produced in the same manner as in Example 2-1 except that a polyimide film is used for the substrate of the photovoltaic elements.

Example 2-4

The solar cell module of Example 2-4 is shown in FIG. 8. The photovoltaic elements are produced in the same manner as in Example 2-1, and the other steps are described below.
[Cell block]
Five of the elements produced above are connected in series to produce the solar cell block. The method for producing the solar cell block is the same as in Example 2-1.
[Flat-plate solar cell module]
The flat-plate-shaped solar cell module is produced using the above 5-series solar cell block in the same manner as in Example 2-1.
[Bending of edge portions]
The four corners of the flat solar cell module are cut by corner shears. After that, the shorter edges are folded 180° and the longer edges are bent 90° on the light-receiving side by processing with the bender. The height of the upright portions in the bent portions of the longer edges is 25 mm.

[Press processing]
A curved portion is provided by press processing. The curved portion is made by interposing the solar cell module between the lower mold having the projected portion and the upper mold having the depressed portion. The press processing is done so that the peak strain of the substrate of photovoltaic element is 0.6% (residual strain 0.4%).

Example 2-5

The solar cell module is produced in the same manner as in Example 2-4 except that a polyimide film is used for the substrate of the, photovoltaic element.

Comparative Example 2-1

The solar cell module is produced in the same manner as in Example 2-1 except that the press processing is done so that the peak strain of the substrate of the photovoltaic element is 0.9% (residual strain 0.7%).

Comparative Example 2-2

The solar cell module is produced in the same manner as in Example 2-1 except that the press processing is done so that the peak strain of the substrate of photovoltaic element is 1.4% (residual strain 1.2%).

Comparative Example 2-3

The solar cell module is produced in the same manner as in Example 2-1 except that the press processing is done so that the peak strain of the substrate of photovoltaic element is 4.8% (residual strain 4.4%).

Comparative Example 2-4

The solar cell module is produced in the same manner as in Example 2-3 except that the press processing is done so that the photovoltaic element is 1.4% (residual strain 1.2%).

Comparative Example 2-5

The solar cell module is produced in the same manner as in Example 2-4 except that the press processing is done so that the peak strain of the substrate of photovoltaic element is 1.4% (residual strain 1.2%).

The solar cell modules are evaluated as to the following items. The results are shown in Table 2 below.

TABLE 2

| | Initial external | After hi-temp and hi-humid test | | After temp/humid cycle test | | HHFB low-illuminance Voc | HHRB low-illuminance Voc | Outdoor exposure | | | Observation by SEM |
|---|---|---|---|---|---|---|---|---|---|---|---|
| | appearance | external appearance | conversion efficiency | external appearance | conversion efficiency | | | 3 months | 6 months | 12 months | |
| Ex 2-1 | ◉ | ◉ | ◉ | ◉ | ◉ | ◉ | ◉ | ◉ | ◉ | ◉ | ◉ |
| Ex 2-2 | ○ | ○ | ◉ | ○ | ◉ | ◉ | ◉ | ◉ | ◉ | ◉ | ◉ |
| Ex 2-3 | ◉ | ◉ | ◉ | ◉ | ◉ | ◉ | ◉ | ◉ | ◉ | ◉ | ◉ |
| Ex 2-4 | ◉ | ◉ | ◉ | ◉ | ◉ | ◉ | ◉ | ◉ | ◉ | ◉ | ◉ |
| Ex 2-5 | ◉ | ◉ | ◉ | ◉ | ◉ | ◉ | ◉ | ◉ | ◉ | ◉ | ◉ |
| Comp Ex 2-1 | ◉ | ○ | ○ | ○ | ○ | Δ | Δ | ○ | Δ | X | X |
| Comp Ex 2-2 | ○ | ○ | ○ | ○ | ○ | X | X | Δ | X | X | X |
| Comp Ex 2-3 | X | X | Δ | X | Δ | X | X | X | X | X | X |
| Comp Ex 2-4 | ◉ | ○ | ○ | ○ | ○ | X | X | Δ | X | X | X |
| Comp Ex 2-5 | ◉ | ○ | ○ | ○ | ○ | X | X | Δ | X | X | X |

Initial appearance
The solar cell modules (in the final form) are evaluated as to the initial external appearance, including the failure in filling and surface flaws of a solar cell. At the same time, they are also evaluated in terms of the aesthetic sense as a building material and a roof material. The evaluation results are shown in Table 2, based on the following criteria.

⊚: No defect is present in the external appearance, and the module is also excellent in the aesthetic sense as a building material and a roof material.

○: Some defects are present in the external appearance but pose no problem in practical use.

x: Very large defects appear in the external appearance with great failure in filling and flaws in the surface, or the module is extremely damaged in the aesthetic sense as a building material and a roof material.

The high temperature and high humidity test and the temperature/humidity cycle test are conducted under the same test conditions and evaluation criteria as described previously.

Forward bias under storage at high temperature and high humidity (HHFB test).

The solar cell modules are placed under the circumstance of 85° C./85% (relative humidity). In this case, light is prevented from entering the samples either by keeping the inside of the test machine in a light-intercepting circumstance or by shielding the light-receiving surfaces of the samples. Under this circumstance, wiring is so set that the optimum operating voltage (Vmp) can be applied in the forward direction of the internal PV circuit (diode component) in the solar cells, the voltage is kept for 2000 hours, then the solar cell modules are taken out, low illuminance Voc (open-circuit voltage (Voc) under illuminance of 200 Lx) is measured for each cell of the photovoltaic elements, and a change rate thereof is calculated from the initial value before the start of the test. The lowering in low-illuminance Voc indicates lowering in shunt resistance due to junction defects inside the photovoltaic element. Namely, the lowering indicates an increase in internal defects.

The evaluation results are shown in Table 2, based on the following criteria.

⊚: The change of low-illuminance Voc is less than 1.0%.

○: The change of low-illuminance Voc is not less than 1.0% and less than 3.0%.

Δ: The change of low-illuminance Voc is not less than 3.0% and less than 5.0%.

x: The change of low-illuminance Voc is not less than 5.0%.

Reverse bias under storage at high temperature and high humidity,(HHRB test).

The solar cell modules are placed under the circumstance of 85° C./85% (relative humidity). In this case, the light is prevented from entering the samples either by keeping the inside of the test machine in a light-intercepting circumstance, or by shielding the light-receiving surfaces of the samples. Under this circumstance, wiring is so set that the operation voltage (Vf) of the bypass diode can be applied in the reverse direction of the internal PV circuit (diode component) or the solar cell, the voltage is kept for 2000 hours, the solar cell modules are then taken out, the low-illuminance Voc (open-circuit voltage (Voc) under the illuminance 200 Lx) is measured for each cell of the photovoltaic elements, and the change rate thereof is calculated from the initial value before the start of the test. The lowering in low-illuminance Voc indicates lowering in shunt resistance due to the junction defects inside the photovoltaic element. Namely, the lowering indicates an increase in internal defects.

The evaluation results are shown in Table 2, based on the following criteria.

⊚: The change of low-illuminance Voc is less than 1.0%.

○: The change of low-illuminance Voc is not less than 1.0% and less than 3.0%.

Δ: The change of low-illuminance Voc is not less than 3.0% and less than 5.0%.

x: The change of low-illuminance Voc is not less than 5.0%.

Outside exposure

The solar cell modules are set outdoors (on the outdoor exposure ground in the Ecology Research Center of CANON KABUSHIKI KAISHA, 1-1 Kizugawadai 4-chome, Kizu-cho, Soraku-gun, Kyoto) and are evaluated after three months, six months, and twelve months. The low illuminance Voc (the open-circuit voltage (Voc) under the illuminance 200 Lx) is measured for each of the photovoltaic elements, and the change rate thereof is calculated from the initial value before the start of the test.

The evaluation is made based on the following criteria.

⊚: The change of low-illuminance Voc is less than 1.0%.

○: The change of low-illuminance Voc is not less than 1.0% and less than 3.0%.

Δ: The change of low-illuminance Voc is not less than 3.0% and less than 5.0%.

x: The change of low-illuminance Voc is not less than 5.0%.

Observation by SEM

Portions that seem to have the highest strain are cut out of the solar cell modules and are observed by a scanning electron microscope (SEM). The evaluation is made based on the following criteria.

○: No crack is observed in the surface of photovoltaic element.

x: Cracks are observed in the surface of photovoltaic element.

As apparent from Table 2, the solar cell modules of the examples of the invention demonstrate good initial appearance and good appearance even after the high temperature and high humidity test and after the temperature/humidity cycle test. In Example 2-2 where the residual strain is adjusted to be as small as 0.1%, the resulting solar cell module gives the impression that the work is somewhat poor, but it is of the level posing no problem. From the aspect of electrical characteristics, they demonstrate no lowering in low-illuminance Voc even after the high temperature and high-humidity forward bias and reverse bias tests (HHFB and HHRB). They show no degradation of performance and no defect even after 12 months of outdoor exposure. When the surfaces of the photovoltaic elements in the solar cell modules of the examples are observed by SEM, no crack is observed, which does not contradict the above test results. Therefore, the solar cell modules are produced with high reliability.

On the other hand, cracks are observed in observation by the SEM of the solar cell module of Comparative Example 2-1, where the peak strain during processing is 0.9% and the residual strain is 0.7%. The cracks are considered to be formed in the surface of the element when the photovoltaic elements are subject to the strain of 0.9% during processing. When this sample is subjected to the forward and reverse bias tests, lowering in low-illuminance Voc occurs near 1500 hours. In the outdoor exposure the lowering in low-illuminance Voc takes place gradually from six months after exposure onset.

Further, in the solar cell modules of Comparative Examples 2-2, 2-4, and 2-5 where the peak strain during processing is 1.4% and the residual strain is 1.2%, many cracks are observed in the SEM observation. In the HHFB and HHRB tests, lowering in low-illuminance Voc takes place near 1200 hours. In the outdoor exposure test the lowering in low-illuminance Voc also occurs three months after exposure onset. In the appearance after the high temperature and high humidity test and after the temperature/humidity cycle test, slight whitening of the covering material is observed, though it is of the level posing no problem. In the solar cell module of Comparative Example 2-3 where the peak strain during processing is 4.8% and the residual strain is 4.4%, change of the initial appearance after processing is observed visually on the photovoltaic elements (color changed). A lot of cracks are also recognized in the observation by SEM, of course. In the HHFB and HHRB tests the lowering in low-illuminance Voc is also observed before 1000 hours, which does not contradict the observation results of cracks. Further, in the appearance of the covering material, since whitening is also recognized in the processed portions, and since the whitening will become more prominent after the high temperature and high humidity test and after the temperature/humidity cycle test, there is a problem in the aesthetic sense as a roof material.

According to the present invention, since the deformable region of the photovoltaic element becomes clear, the product developing speed of a wide variety of solar cell modules can be increased greatly. Further, since the regions above the photovoltaic elements can be freely processed without degrading the characteristics of the solar cell, there can be provided solar cell modules which are excellent in the aesthetic sense and in design. The solar cell modules processed in this way become solar cell modules with high reliability for a long period.

What is claimed is:

1. A method for manufacturing a solar cell module having a photovoltaic element encapsulated with a resin on a support member, comprising the step of:

forming a bent portion in the photovoltaic element and in the support member, wherein the bent portion is formed by applying a pressure of 500 kgf/cm$^2$ or less in the normal direction to a surface of the photovoltaic element using means which are in contact with the solar cell module.

2. The method according to claim 1, wherein the formation of the bent portion is performed by press molding.

3. The method according to claim 2, wherein a buffer material is provided between a mold for the press molding and the solar cell module.

4. The method according to claim 2, wherein a clearance is provided between a mold for the press molding and the solar cell module.

5. The method according to claim 1, wherein a part or the whole of the support member is plastically deformed by applying the pressure only on a portion of the support member where the photovoltaic element of the solar cell module is not mounted.

6. The method according to claim 1, wherein the formation of the bent portion is performed by work with a roller former.

7. The method according to claim 6, wherein a roller of the roller former comprises a buffer material on its surface.

8. The method according to claim 1, wherein the formation of the bent portion is performed by bending with a bender.

9. The method according to claim 8, wherein a buffer material is provided between a blade of the bender and the solar cell module.

10. The method according to claim 8, wherein a bender having a blade with a radius of curvature of not less than 100 mm is used.

11. The method according to claim 1, wherein the photovoltaic element comprises a flexible substrate and a non-monocrystalline semiconductor.

12. The method according to claim 1, comprising providing the bent portion with at least one of a continuous depressed portion and a continuous projected portion.

13. The method according to claim 1, wherein the resin has a smaller thickness at the bent portion than at the other portions.

14. The method according to claim 1, wherein a resin encapsulating a light-receiving surface of the photovoltaic element contains a fibrous inorganic compound.

15. The method according to claim 14, wherein the fibrous inorganic compound is absent in the bent portion.

16. The method according to claim 1, wherein the support member comprises a metal.

17. A method for manufacturing a building material having a photovoltaic element encapsulated with a resin on a support member, comprising the step of forming a bent portion in the photovoltaic element and in the support member, wherein the bent portion is formed by applying a pressure of 500 kgf/cm$^2$ or less in the normal direction to a surface of the photovoltaic element using means which are in contact with the building material.

18. The method according to claim 17, wherein the formation of the bent portion is performed by press molding.

19. The method according to claim 18, wherein a buffer material is provided between a mold for the press molding and the building material.

20. The method according to claim 18, wherein a clearance is provided between a mold for the press molding and the building material.

21. The method according to claim 17, wherein a part or the whole of the support member is plastically deformed by applying the pressure only on a portion of the support member where the photovoltaic element of the building material is not mounted.

22. The method according to claim 17, wherein the formation of the bent portion is performed by work with a roller former.

23. The method according to claim 22, wherein a roller of the roller former comprises a buffer material on its surface.

24. The method according to claim 17, wherein the formation of the bent portion is performed by bending with a bender.

25. The method according to claim 24, wherein a buffer material is provided between a blade of the bender and the building material.

26. The method according to claim 24, wherein a bender having a blade with a radius of curvature of not less than 100 mm is used.

27. The method according to claim 17, wherein the photovoltaic element comprises a flexible substrate and a non-monocrystalline semiconductor.

28. The method according to claim 17, comprising providing the bent portion with at least one of a continuous depressed portion and a continuous projected portion.

29. The method according to claim 17, wherein the resin has a smaller thickness at the bent portion than at the other portions.

30. The method according to claim 17, wherein a resin encapsulating a light-receiving surface of the photovoltaic element contains a fibrous inorganic compound.

31. The method according to claim 30, wherein the fibrous inorganic compound is a bent in the bent portion.

32. The method according to claim 17, wherein the support member comprises a metal.

* * * * *